United States Patent [19]
Schaffer et al.

[11] Patent Number: 5,909,674
[45] Date of Patent: Jun. 1, 1999

[54] METHOD FOR OPTIMIZING THE LAYOUT AND CHARGE MAPS OF A FLOWLINE OF PICK AND PLACE MACHINES

[75] Inventors: J. David Schaffer, Wappingers Fall; Murali Mani, Chappaqua, both of N.Y.

[73] Assignee: Philips Electronics North America Corp., New York, N.Y.

[21] Appl. No.: 08/772,393

[22] Filed: Dec. 23, 1996

[51] Int. Cl.$^6$ .................................................. G06F 15/18
[52] U.S. Cl. ...................... 706/13; 364/474.15; 395/81; 395/82
[58] Field of Search ................ 364/474.11, 474.15, 364/474.23; 395/13, 51, 81, 82; 706/13, 45

[56] References Cited

U.S. PATENT DOCUMENTS

| | | | |
|---|---|---|---|
| 4,628,464 | 12/1986 | McConnell | 395/82 |
| 4,896,087 | 1/1990 | Onaga et al. | 395/82 |
| 4,994,980 | 2/1991 | Lee et al. | 364/474.11 |
| 5,390,283 | 2/1995 | Eshelman et al. | 706/13 |
| 5,581,657 | 12/1996 | Lyon | 706/13 |

OTHER PUBLICATIONS

R. Suri and B.–R. Fu, "On Using Continuous Flow Lines for Performance Estimation of Discrete Production Lines," Proc. 1991 Winter Simulation Conference, pp. 968–977, Dec. 1991.
C. Liu and F.–s. Tu, "Buffer Allocation via the Genetic Algorithm," Proc. 33rd Conf. on Decision and Control, pp. 609–610, Dec. 1994.
R. Kumar and H. Li, "Integer Programming Approach to Printed Circuit Board Assembly Time Optimization," IEEE Trans. on Components, Packaging, and Manufacturing Technology, Part II, vol. 18(4), pp. 720–727, Nov. 1995.
B. Porter, et al., "Machine Requirements Planning and Workload Assignment using Genetics Algorithms," Proc. 1995 IEEE Int'l. Conf. on Evolutionary Computation, vol. 2, pp. 711–715, Nov. 1995.
I. Or and E. Duman, "Optimization Issues in Automated Production of Printed Circuit Boards: Operations Sequencing, Feeder Configuration and Load Balancing Problems," Proc 1996 IEEE Conf. on Emerging Technologies and Factory Automation, vol. 1, pp. 227–232, Nov. 1996.
The CHC Adaptive Search Algorithm: How to Have Safe Search When Engaging n Nontraditional Genetic Recombination, Larry J. Eshelman, Philips Laboratories, North American Philips Corp. 345 Scarborough Road, Briarcliff Manor, NY 10510, pp. 265–283, 1991.

*Primary Examiner*—Robert W. Downs
*Attorney, Agent, or Firm*—Michael E. Belk

[57] ABSTRACT

A method uses a computer-controlled algorithm that enables production of high-quality layouts and charge maps or set-ups for arbitrary printed circuit boards for electronic component placement machines alone or as one of many in a production line. A class of algorithms known as genetic algorithms employing an initial population of chromosomes are used. Each chromosome represents a set of parameters that control how a layout and charge maps are generated. Problem descriptors, based on one time code are generated. An adaptive searcher searches parameters and generates trial solutions as chromosomes and a heuristic layout generator interprets these chromosomes to generate the layout and charge maps using the problem descriptors.

29 Claims, 13 Drawing Sheets

| 100 — | 1 | 2 | — 100 |
|---|---|---|---|
| 100 — | 3 | 4 | |
| | 5 | 6 | |
| | 7 | 8 | |
| | 9 | 10 | |
| | ⋮ | | |
| | n | n+1 | |

FIG. 8A

| 100 — | 1 | n+1 | — 100 |
|---|---|---|---|
| 100 — | 2 | n+2 | — 100 |
| | 3 | n+3 | |
| | 4 | n+4 | |
| | 5 | n+5 | |
| | 6 | n+6 | |
| | ⋮ | ⋮ | |
| | n | 2n | |

FIG. 8B

METHOD FOR OPTIMIZING THE LAYOUT AND CHARGE MAPS OF A FLOWLINE OF PICK AND PLACE MACHINES

This invention relates to a method for generating the layout and charge maps of a flowline of component placement machines by finding a near optimal solution.

RELATED APPLICATIONS

U.S. Pat. No. 5,390,283 filed Oct. 23, 1992 is herein incorporated by reference.

BACKGROUND OF THE INVENTION

Electronic component placement machines, sometimes called pick-and-place machines, are known. Typically, these machines are used to load chip components or parts onto a printed circuit board (PCB) for subsequent processing such as soldering the chip components to PCB traces. A typical machine includes a platform for supporting the PCB—usually supplied on a conveyor—adjacent to which are provided a plurality of part feeders. The chip components may be provided on reels of tape supplied to the feeders or as stick or bulk feeders. Components may also be provided in trays.

The typical machine generally has a head movable in four dimensions: in the X-Y plane, parallel to the PCB; along the Z-axis, up and down with respect to the PCB and rotatable in the x-y plane with respect to the PCB. One or more grippers may be present, each gripper including a pipette module (PM) or pipette, a phi placement unit (PPU), and a nozzle. Pipettes are provided with holding power which may be suction (applied to a part through a nozzle of the pipette). Attached to an active pipette is a nozzle which typically is a vacuum nozzle (although other types of grippers, such as mechanical grippers, etc. are useable) and some means to align the part precisely on the nozzle. Grippers are typically selective, i.e., grippers are generally only able to pick up parts within some range of size, shape and/or weight.

To improve production throughput, it is desirable to reduce time to load or populate the PCB while accurately populating the PCB. Newer machines available on the market use multiple grippers so that plural parts can be picked and placed during each head movement. The problem then becomes assigning parts to appropriate feeders, a plurality of feeders to limited space on feeder bars, and nozzles to PMs, and further, solving one or more head-routing problems to minimize time needed to populate the PCB. The assignment of parts to feeders, feeders to space on the feeder bars and nozzles to PMs is a "layout" and specification of a control program for the machine is a "charge map".

Combinatorial difficulties are evident with modern machines such as a Philips Fast Component Mounter (FCM) which, for example in one embodiment, may have 16 grippers, 96 tape feeders (feeding up to 96 part types) or 48 bulk feeders (feeding 176 part types) or a combination thereof, and a plurality of nozzles capable of handling part types varying in size. In addition, other constraints on machine configuration also have to be taken into account. For example, larger parts may require an additional alignment step or larger parts in one feeder slot may block adjacent feeder slots which thus cannot be used.

Combinatorial difficulties are also evident with more accurate component placement machines such as a Philips Advanced Component Mounter (ACM). An ACM may have, for example, a plurality of grippers, a plurality of parts feeders, one or more nozzle exchange units and one or more tray stackers, each for holding a plurality of trays. Constraints on machine configuration, as for the FCM, have to be taken into account. In addition, other constraints such as, for example, each level of a tray stacker having constraints on a total size and number of trays which may be held and on part types which will fit on each level must be considered. Efficient use of tray stackers which take time to swap the trays offered to the machine require that placement actions and tray swapping actions should happen in parallel to the extent possible. Further, nozzles may have to be exchanged so that a matching nozzle is available for gripping each part type. Manual solutions, on a trial and error basis, or computer software which may use manual improvements are normally used to establish a machine configuration for each new PCB layout. This method is time consuming and does not necessarily produce efficient results. In addition, whether the configuration chosen is optimal is difficult to judge. Some limited computer assistance is available for some machines.

A near-optimal configuration for placement on a PCB layout is available for Philips Fast Component Mounter as disclosed in Eshelman et. al, U.S. Pat. No. 5,390,283 (hereinafter '283 patent). However, component placement machines which provide greater accuracy of placement, such as the Philips Advanced Component Mounter (ACM) may also be required for part placement. Accordingly, a good computer-controlled algorithm capable of providing a near-optimal configuration for use with ACM machines, FCM machines and combinations of ACMs and FCMs is needed as is such an algorithm which one skilled in the art may alter for use with other machines.

SUMMARY OF THE INVENTION

An object of the present invention is to provide a method using a computer-controlled algorithm that enables production of high-quality layouts and charge maps or set-ups for arbitrary PCBs for electronic component placement machines alone or as one of many in a production line.

An additional object of the present invention is to provide a method using a computer-controlled algorithm that enables production of optimal or near-optimal layouts and charge maps for arbitrary tasks for a combination of machines for electronic component placement.

A further object of the present invention is to provide a class of algorithms known as genetic algorithms capable of providing near-optimal solutions for machine configuration problems for machines or a combination of machines employing at least one gripper and plural parts feeders which may include trays and which may employ nozzle exchange units.

Another object of the present invention is to employ genetic algorithms eliminating incestuous matings between parent chromosome strings, applying a particularly vigorous form of crossover to pairs of parent strings to create new offspring, employing survival of the fittest involving both parent and child chromosome strings, and applying population mutation only when the generated solutions converge after a limited number of iterations.

A further object of the present invention is to provide a more optimal layout and charge map given a specific printed circuit board.

For a better understanding of the invention, its operating advantages and specific objects attained by its use, reference should be had to the accompanying drawings and descriptive matter in which there are illustrated and described the preferred embodiments of the invention.

BRIEF DESCRIPTION OF THE DRAWINGS

FIG. 8A illustrates a zig-zag pattern of tray assignment to pallets;

FIG. 8B illustrates a columnar pattern of tray assignment to pallets;

DETAILED DESCRIPTION OF THE PREFERRED EMBODIMENTS

The present method of the invention is generally applicable to electronic component placement machines having at least one pipette module to which at least one or more grippers are attached, movable in at least four dimensions sequentially or simultaneously. For example, an FCM machine has a plurality of part-grasping devices or grippers having phi placement units (PPU) and nozzles. These grippers are attached to pipette modules (PM) movable in at least four dimensions (X, Y, Z and phi in this example) sequentially or simultaneously picking up parts fed from a plurality of feeders and placing them on one or more PCBs under computer control. An ACM machine generally differs in structure; the ACM machine has a plurality of part-grasping devices or grippers each attached to a pipette module which are on one head. As discussed later, the head or manipulator is movable in at least two dimensions, in this example, X and Y. The combination of the gripper and pipette module is moveable in four dimensions, in this example, X, Y, Z and phi. As the number of machines, part-grasping devices, parts, types of feeders and gripper types increases, the complexity of providing a good configuration of a machine and/or a system increases.

The present invention allows use of one or more FCM machines, one or more ACM machines or a combination of FCM and ACM machines. The invention will be explained in its application to providing high-quality layouts and charge maps for several specific commercial placement machines; however, it will be understood that the invention is not limited to such machines but instead, will be generally applicable to any machines in the class as defined. Further, those skilled in the aft will be able to apply the principles as described herein to other machines in this class.

Figure 1A:
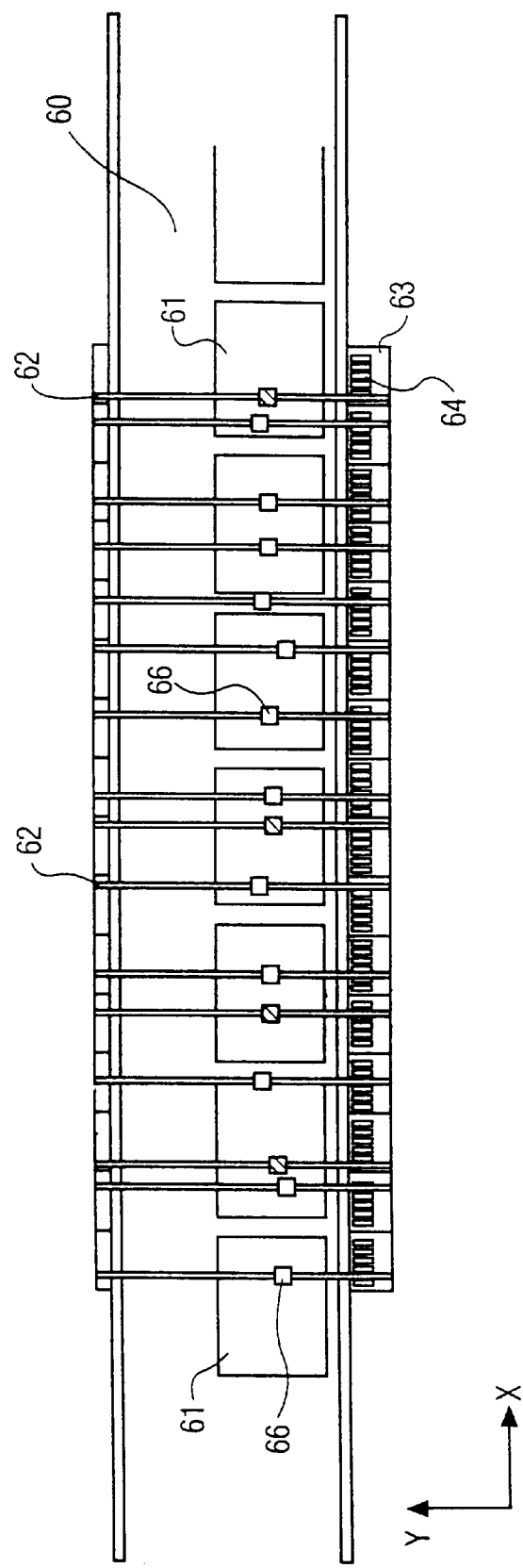
FIG. 1A is a top view of one example of an FCM machine.
Figure 1B:
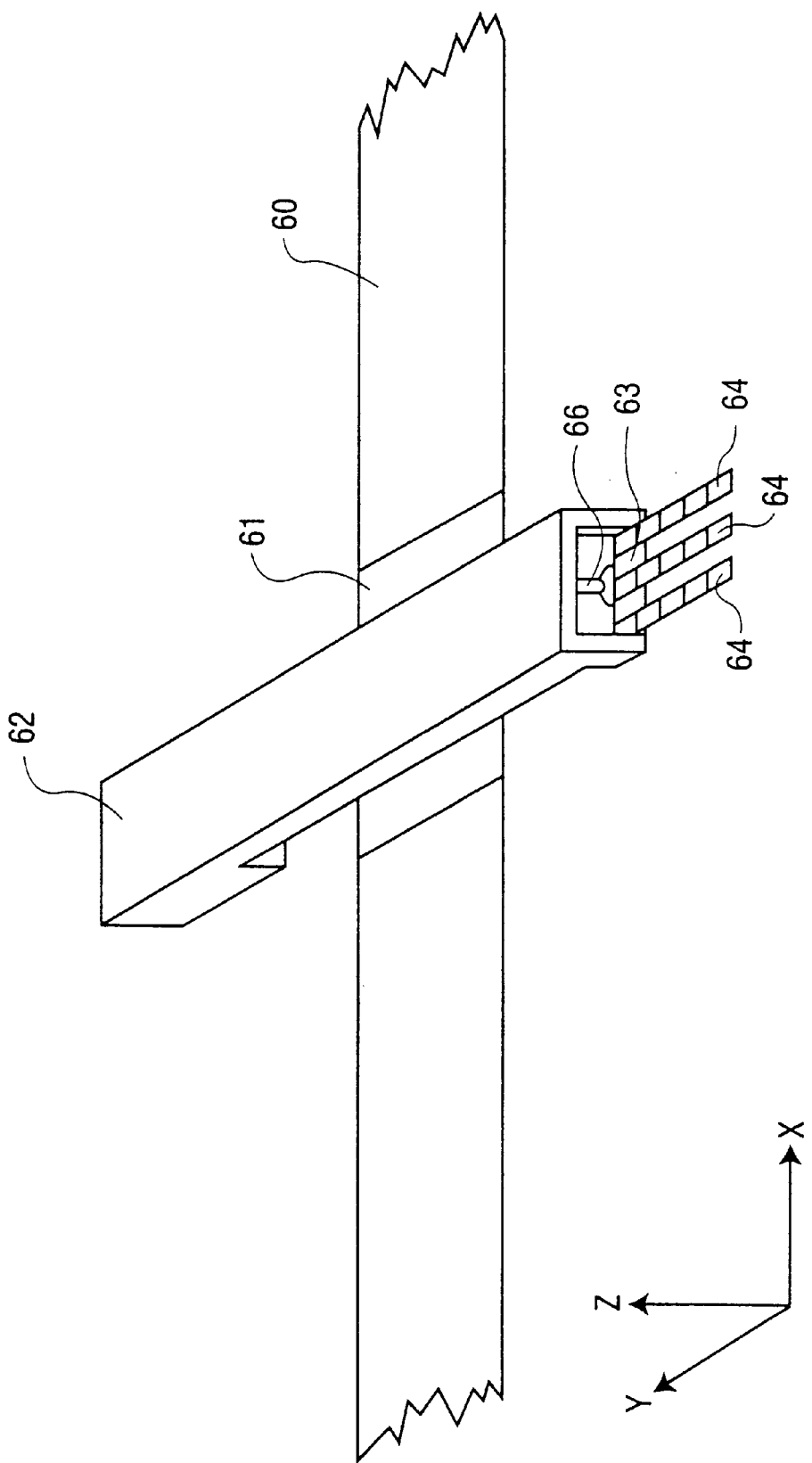
FIG. 1B is a perspective view of one pipette module of an FCM machine.

An overview of the FCM is now presented. A top view of one example of an FCM machine (with 16 pipette modules) is schematically depicted in FIG. 1A and a perspective view of one pipette module in FIG. 1B. The FCM machine includes a transport system 60 that carries a train of printed circuit boards (PCBs) 61 under a series of, in this example, 16 independent pick-and-place or pipette modules (PMs) 62. The transport system 60 advances in steps (index steps) between which the PCBs rest stationary for a period of time while the PMs place some part types. Each PM 62 has a feeder bar 63 (in front of the machine as shown in FIG. 1A) to which can be attached a variety of component feeder types 64 (tapes, sticks, bulk feeders or such). Further, each PM 62 has a width, a portion of which is in its reachable zone. In this example, each PM 62 is 120 mm wide with 80 mm of this being its reachable zone although these dimensions may be easily altered. No interference between PMs is permitted.

Feeders are placed within the reachable zone on the feeder bar 63. For this purpose, feeders are attached at specified intervals through feeder slots. In FIG. 1A for this example, six feeder slots are shown. The transport system 60 travels left to right. New PCBs enter the FCM on a conveyor belt or movable machinery at the left end and completed PCBs exit from the right end. Each PM 62 has a single movable placement head 66 with independent control in the x (left to right), y (front to back), z (up/down), and phi (rotation about z) directions. Each control can have different accelerations and maximum velocities; therefore, the travel time from a pick to a place position is the maximum of the x, y, and phi times. Movement in the z direction is accounted in a fixed delay for pick and for place.

Each pipette module may be fitted with a particular nozzle for picking up parts, a phi placement unit for accurate mechanical alignment, and/or a vision system to compute alignment offset. A nozzle and phi placement unit combination, called a gripper, allows the placement of parts within certain size, shape and/or weight limits. Each part may have a particular gripper type designated or the software may select a suitable gripper from among a number of alternative grippers.

For the FCM, a single board optimization task is, given a parts list, specifying the x, y, and phi location of each part to be placed and its respective gripper or list of alternative grippers and feeder type, and given a specification of a line of FCM machines (how many machines, how many PMs on each), produce a layout and charge maps (described later) that will, in this example, minimize time required to populate the PCBs with all their parts (cycle time). Other merit measures may be substituted or added to the merit measure of cycle time. For example, minimizing set-up and/or changeover time or minimum cycle time while minimizing a number of feeders. The optimization should allow an FCM user to constrain solutions by prespecifying upper limits on a number of grippers of a particular type to be used, and/or a number of feeders feeding a particular part type. Additionally, the FCM user should be free to prespecify that particular grippers be assigned to specific PMs and that particular feeder slots must feed particular part types. Some PMs and some feeder slots may also be prespecified to not be used.

The optimization task also includes a combined products problem. A combination of products of PCBs includes several closely related boards (family members) with the same external dimensions and perhaps similar parts although not required. Some parts may be unique to one or more of the family members. The optimization goal for a combined products problem is to find the best solution based on merit measures. As one example, the best solution sought could be to minimize cycle time for a given mix of combined products where solutions for all products of the combined products share the same layout, i.e., a production line may switch from one product to another without changing any allocations of grippers to pipette modules or part types to feeders.

Figure 2A:
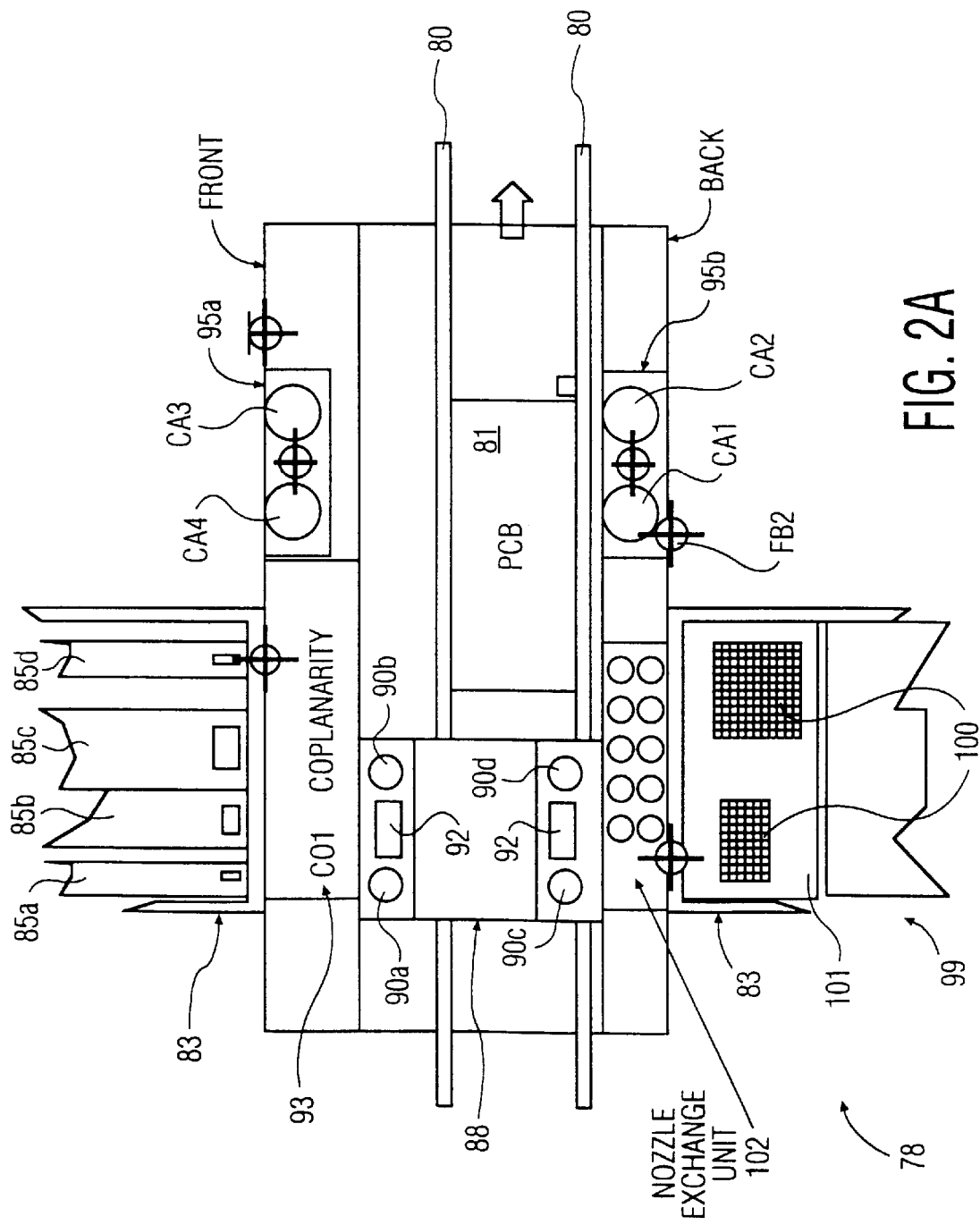
FIG. 2A is a top view of one example of an ACM machine.
Figure 2B:
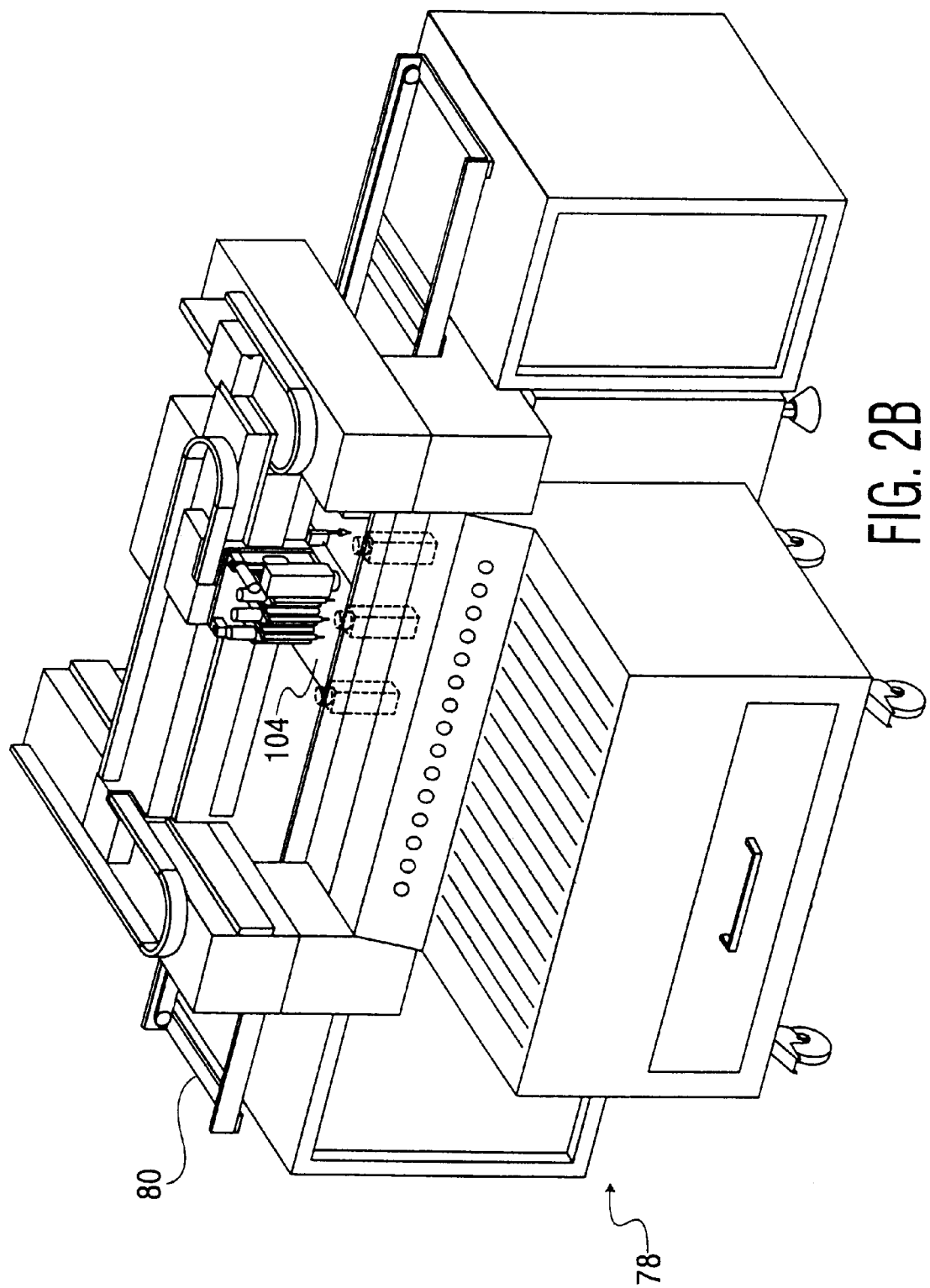
FIG. 2B is a perspective view of one example of an ACM machine.

A general overview of the ACM will now be presented. A top view of an ACM machine 78 is schematically depicted in FIG. 2A and a perspective view in FIG. 23. The ACM machine 78 essentially includes a transport system 80 that carries a printed circuit board (PCB) 81 under, in this example, a manipulator 88. The transport system 80 advances a PCB so that the PCB rests stationary under the manipulator 88 while components are placed. In contrast to the FCM which uses index stepping and exposes only part of the PCB to each PM at each step, in the ACM machine the entire PCB 81 is reachable by all PMs of the ACM 78.

The ACM 78 of the present example has a single movable manipulator 88 with at least one pipette module and gripper 90. The manipulator 88 of the present invention is a self-calibrating Cartesian robot with linear motors and linear scales. The manipulator 88 carries, in the example shown, two grippers 90 and one fiducial camera 92 on each side of the manipulator 88. Additional grippers 90 and/or fiducial cameras 92 may be added. The manipulator 88 can move the grippers 90 within any position of the x-y field. The manipulator 88 contains two y-axis servos and one x-axis servo, each with its own integrated controller and power stages. These controllers are interfaced through an embedded network.

Figure 2C:
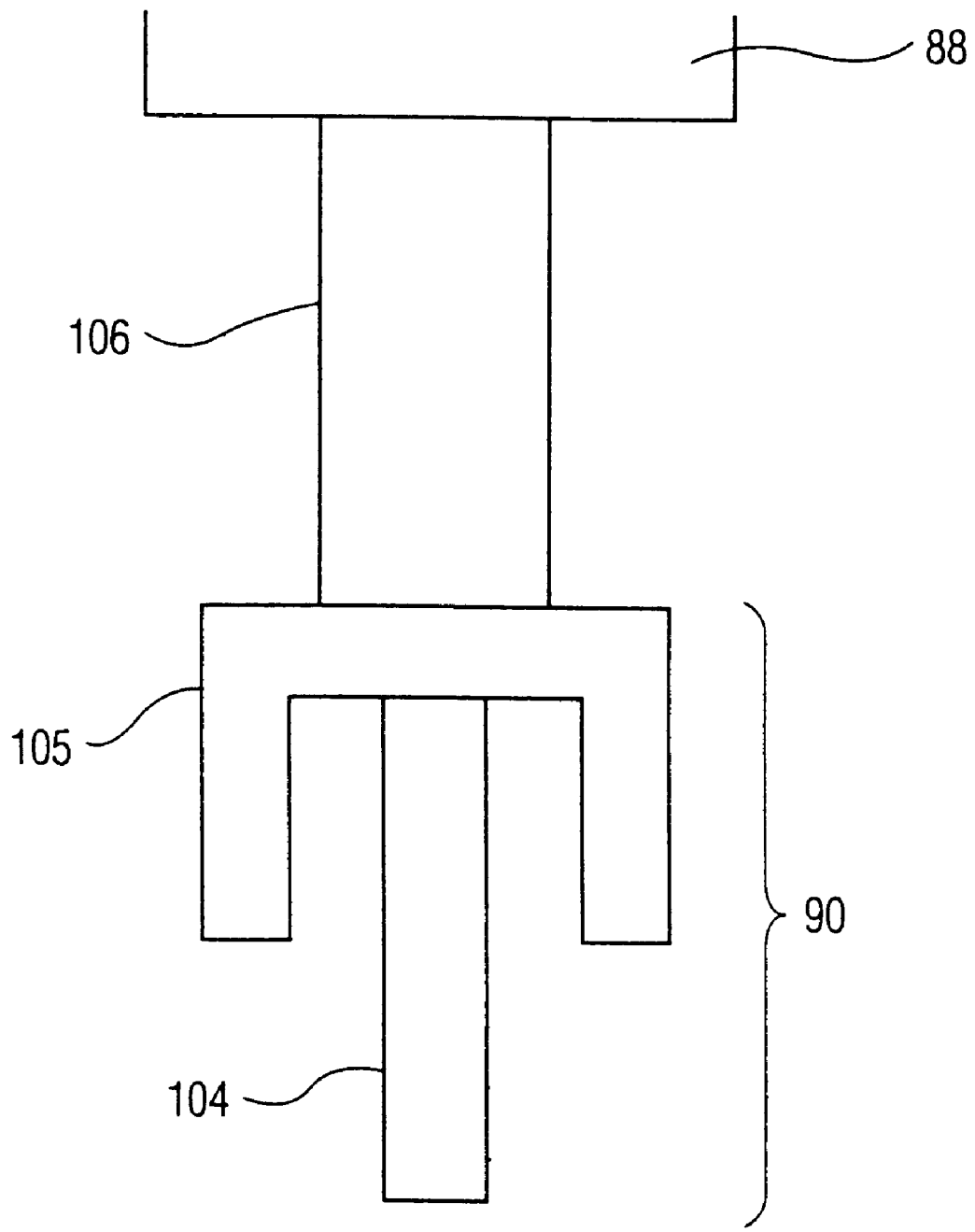
FIG. 2C is a side view of one pipette module of an ACM machine.

As shown in FIG. 2C, each gripper 90 has a nozzle 104 and a PPU 105 for placing components. A pipette module 106 is equipped with individual z-height control, phi rotation control and real time force control. The pipette module 106 and gripper 90 together can pick, rotate and place components within a specified work area of the ACM 78. By placing more pipette modules 106 on the manipulator 88, machine flexibility can be extended.

The ACM 78 has at least one feeder bar 83 and in the example shown in FIG. 2A, has four feeder bars 85. A feeder bar accepts multiple brands of tape-, stick-, bulk-, or tray-feeders on front and/or rear sides of the ACM machine. In the present embodiment, two feeder bars 83 are on a front of the ACM 78 and two feeder bars 83 are on the back of the ACM 78. The two grippers 90-*a* and 90-*b* on the front of the manipulator 88 can pick components from either of the front feeder bars and similarly, the two grippers 90-*c* and 90-*d* on the back of the manipulator 88 can pick components from the back feeder bars. In this example, each feeder bar has feeder slots on which feeders can be assembled. Additionally, the number of supported feeder types need not be restricted; the user should be able to invent a new feeder and attach it to a machine in the line configuration.

Each feeder bar 83 can be configured with a set of feeders 85; each feeder is used for presenting parts to a gripper for pick-up and disposing of the packaging. A tray or a plurality of trays in a traylift unit can be used instead of a number of feeders 85 as discussed later in detail. Feeders 85 can be shared between two placement heads on corresponding sides of the machine. For example, grippers 90-*a* and 90-*b* can share feeders 85 on the front of the ACM 78. However, depending on the machine, not all feeders 85 may be reachable by all grippers 90 on the same side of the machine, for example the head 90-*d* on the extreme right side of the manipulator 88 may not be able to reach feeders 85-*a* at the extreme left end of the feeder bar 83 or vice versa.

Located between the feeder bars 83 and the PCB on each side of the ACM 78, may be a nozzle exchange unit 102, a component alignment (CA) part 95, and/or a coplanarity part 93. In the example shown, the back side includes a nozzle exchange unit 102 and a component alignment part 95-*b* which is part of a vision alignment system for the ACM machine 78. The front side of this example includes a component alignment part 95-*a* and a coplanarity part 93, both of which will be discussed in further detail.

Nozzle exchange units (NEU) 102 allows nozzles 104 on the grippers 90 to be changed during machine operation. Each part to be placed has one or more nozzles which may be used to "pick" the component part for placement. Each nozzle exchange unit 102 has a number of slots for holding nozzles required for placing all or specified parts on the PCB. The manipulator 88 can exchange the nozzle of any PM by moving the PM to an empty slot in the nozzle exchange unit (NEU) 102, dropping its current nozzle in the previously empty slot, moving to a specified nozzle held by the NEU 102, and picking up the specified nozzle. As a result, the ACM has the ability to place many more package types than is possible if the grippers had nozzles assigned and fixed.

A vision alignment system is used to improve placement accuracy of a component with respect to the PCB 81. Possible deviations (translation, rotation) of a part with respect to a gripper and/or PCB are calculated. The vision alignment system in this example, includes the following although variations are apparent to one skilled in the art:

—A Fiducial Alignment (FA) part 92, mounted on the manipulator 88, for alignment with board pattern by measuring global and/or local fiducials. The FA 92 can also be used for Bad Mark Sensing (checking for the presence of special marks that instruct the machine not to populate all or part of a PCB) and feeder pick-up point calibration (calibrating and checking to determine if a part is present at the feeder).

—A Component Alignment (CA) part 95-*a* located between the feeder bar 83 and the PCB 81, (in the present system, one on each side although optionally, only one on one side) for alignment and checking (2D-inspection) of components' leads, edges and bumps. In the present invention, two cameras are included in each CA 95; however, each camera of each CA 95 may have a same or different Lens and similarly, if two CA parts 95 are included in an ACM machine, combinations of leases may be used.

Optionally, a coplanarity part 93, located between a feeder bar 83 and the PCB 81, for 3-D inspection on all component leads and bumps.

Figure 3:
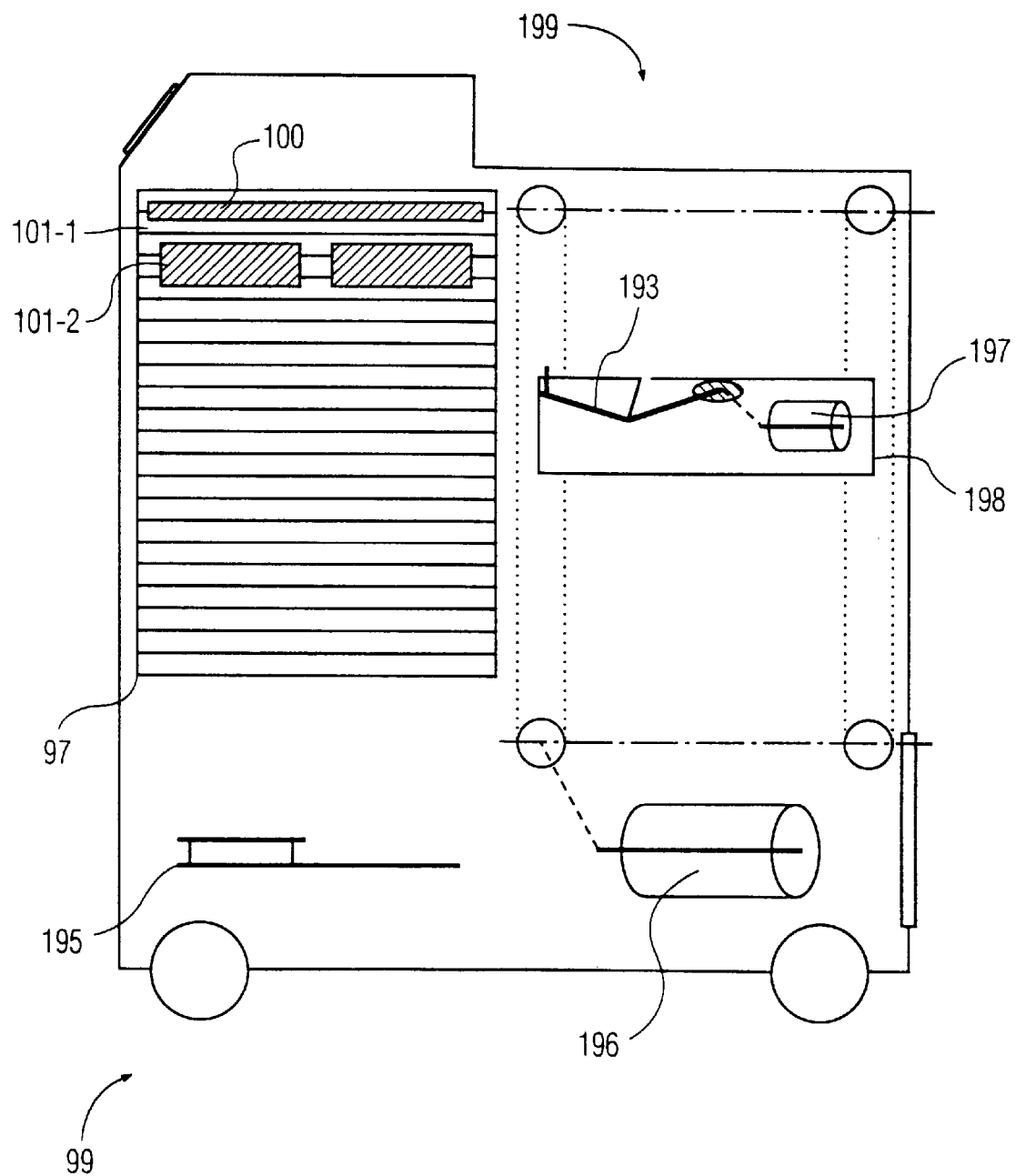
FIG. 3 is a view of a traylift unit.

A traylift unit 99, as shown in FIG. 3, includes a cabinet or tray stack 97 storing one or more pallets, together with an automatic pallet exchange mechanism 199 which includes a lift unit 198. The pallet exchange mechanism 199 includes a lift motor 196 to lift and lower the lift unit 198. The lift unit 198 includes a puller 193 which moves the lift unit to a location to retrieve an appropriate tray using a puller motor 197. A controller 195 controls operation of these motors and units.

One pallet or shelf 101-*n* is handled by the exchange mechanism 199, while all other pallets 101 reside in the cabinet. A pallet may hold one or more trays. Each tray 100 is placed on a pallet, and offered in its entirety to the ACM machine for component pick-up. Each tray 100 may contains a matrix of cells; each cell can contain a component. Trays 100 can be of varying heights and can hold various types of components. The components are all the same type within a tray 100, but the trays on a pallet may contain different component types. The traylift unit 99 can remove a pallet 101 from any shelf in the stack and raise it to the position appropriate to allow access by a gripper 90. Of course a tray swap, the operation of lowering a pallet reinserting it into its shelf and retrieving another and presenting it to the manipulator, takes time which, in the present invention is considered in developing a layout and charge map.

In general, the manipulator 88 will move to a location on one of the feeder bars 83, for example, feeder 85-a where one of the placement heads 90 (90-a in this example) picks up a component. Optionally, the manipulator 88 then moves to another location on one of the feeders on the same side for efficiency, in this example feeder bar 85-b, where the other placement head 90-b on the same side of the manipulator picks up a second component. The manipulator 88 next moves to a part of the vision alignment system, in this example the CA part 95-a on the same side of the ACM 78. The manipulator 88 next moves to the PCB 81 and places one of the parts as specified (optionally imaging one or more local fiducials) and then, if applicable, places the other part as specified, the placement considering information attained from the vision alignment system. This operation is called a "charge". This sequence will continue, with the manipulator moving to both sides of the ACM 78 to pick-and-place all components for the PCB 81. A tray swap can be performed simultaneously while other functions are being performed, for efficiency.

An optimal solution for picking-and-placing all components on a PCB 81 is desired. For the ACM, optimization considerations include reachability constraints in that not all placement heads can reach all positions on the feeder bars. Feasible solutions must be found that do not require more space than is available on feeder bars. Further, the manipulator 88 must use different accelerations in different dimensions when handling different components, i.e., the maximum acceleration at which a part can be moved.

Due to the ability to exchange nozzles on the placement heads 90 during machine operation, optimization must consider making nozzle assignment and exchange decisions while striving for feasibility. In the preferred embodiment, a minimum required feeder bar space of each appropriate nozzle is a factor in determining optimization although minimum numbers of PMs 90 assigned to each nozzle type could be considered. Nozzle assignment decisions are also considered based on a prorated share of the pick-and-place workload each PM can accomplish, although consideration could also be based on a target number of PMs 90.

To place components on a PCB, an optimal configuration of the parts, grippers, etc. is desired. A layout and a charge-map is a solution to such a configuration problem. A charge is one pick-and-place cycle with specific parts named. A charge map is a list of specific charges which, when executed in sequence, will completely populate a specific PCB. To create a layout and charge map, types of nozzles must be identified and assigned to placement heads and nozzle exchange units and parts must be identified, assigned to feeders or trays, and grouped into charges.

Constraints must be met for a charge-map to be valid. First, assignment of a large part feeder (a feeder which feeds large parts in tape from, stick, etc.) to a slot on a feeder bar will prevent neighboring slots from being used. Similarly, tall trays can block neighboring slots on the tray stacker. Second, appropriate nozzles of specified types must be used to pick up a component; therefore, certain nozzles can be used to pick up only appropriate parts and thus, certain nozzles can be used to pick up only from certain feeders or trays. Placement of trays within a tray stacker must be considered so that parts can be retrieved within a required time frame. In this example, it is assumed not all grippers can reach all positions on the feeder bars, so reachability must be taken into account when determining which placement heads to use to pick particular parts.

Constraints as to different speeds and accelerations when handling different package types must also be considered for ACM machines as well as FCM machines. For the ACM machine, the manipulator can move only as fast as the slowest part picked-up. Further, execution times can be estimated for an FCM machine based on travel to pick location, pick-up time, travel to place location, and place time and estimated for an ACM machine based on several precomputed elements such as travel to pick location, pick-up time, travel to alignment camera, travel to place location, place time, and other possible factors (coplanarity check, checks for right location, etc.). For the FCM machines, these constraints are easier to meet as each head only handles one part at a time and the estimated execution times are simpler to calculate, as set forth in the '283 patent.

User constraints, such as assigning a specific nozzle to a pipette module and/or a specific feeder or part type to a specific slot on a feeder bar or traylift unit, also must be considered.

Differences in structure and function between ACMs and FCMs may impact the approach. To account for the structure of the ACM, desirability calculus used when making nozzle assignment decisions while striving for feasibility is altered from that of the FCM system of the '283 patent. In the '283 system, desirability calculus was based on minimum numbers of placement heads assigned to each nozzle type whereas in the present invention, it is based on a minimum required feeder bar space of each appropriate nozzle. In addition, the desirability calculus used when making nozzle assignment decisions while striving for optimum balance was changed from being based on a target number of pipette modules to being based on a prorated share of the pick-and-place workload each nozzle can accomplish.

Further, decisions about which nozzles are most desirable for each PM are now based on more factors than when using the '283 FCM since the FCM uses index stepping which exposes only part of the PCB to each pipette at each step, while the entire PCB is reachable on the ACM 78. Also, the weighting of these factors had to be adjusted so that the greater amount of feeder bar space on the ACM 78 does not dominate these decisions. Assigning feeders to feeder bars and part types to feeders also considers travel time from a pick location to a component alignment part. How a tray stacker is filled to stay within reachability constraints and optimize efficiency is also considered.

In addition, sharing of feeder bar space between placement heads is considered. Use of trays and tray stackers is also considered in the present invention. Pairing and packing trays of varying heights, widths and depths for example, on different levels of the tray stacker to minimize the disparity between heights, widths and depths of trays on each level and arranging the trays within the stack to minimize the number of tray exchanges and time between exchanges are also factors considered in developing a charge map. Further, for which machine, FCM or ACM, or a combination of machines, should be used for each part type is also considered.

An approach of the present invention is now discussed in more detail. The present invention is a method for generating a near-optimal layout and charge maps for the component placement machine(s), given a list of parts to be placed and taking into account the above considerations. The method may be embodied in computer program(s). For example, a parts list may optionally specify for each part to be placed, any combination of the following: a) a unique part number, b) a part type, c) package type (external dimensions), d) its location (x, and y), e) local component fiducials, f) orientation for placement (phi rotation) and g) which members of a PCB combined products need this part.

Figure 4:
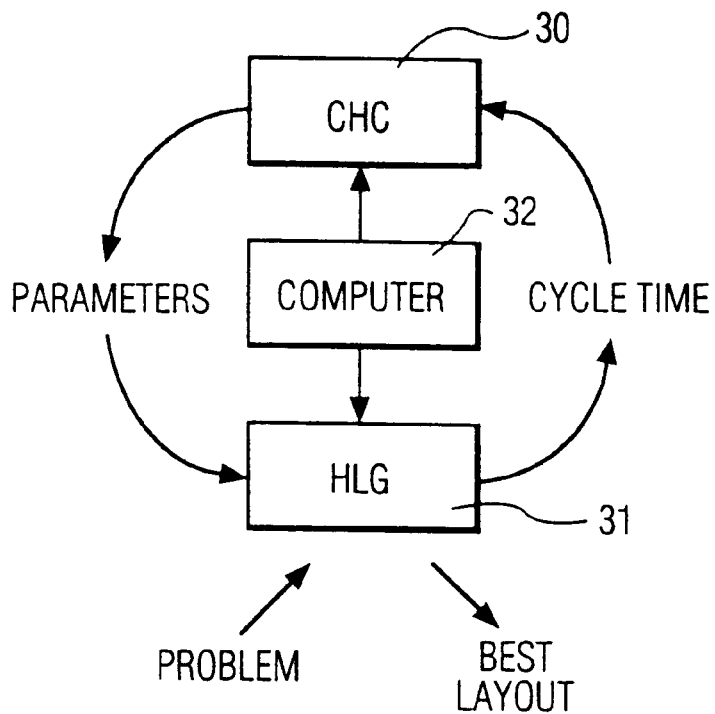
FIG. 4 is a data flow diagram of a method of the present invention.

The present invention shown in FIG. 4 includes two major items: a) HLG: a heuristic layout (charge-map) generator 31; and b) CHC: an adaptive search algorithm (genetic algorithm) for searching parameters that control HLG 31. CHC 30 generates trial solutions in the form of parameter values, i.e., trial parameter sets, and HLG 31 interprets or uses these trial solutions (for a given set of parts and placement machines) to generate layouts and charge maps, returning to CHC 30 a merit measure of each charge map's merit (in this example, an estimate of time to execute the solution) as shown in FIG. 4. A merit measure may be a single value, a vector of values, or a matrix of values, for example, indicating a measure of the chromosomes merit for prespecified criterion or criteria.

The heuristic layout generator (HLG) is an algorithm for solving configuration problems whose behavior can be altered by altering a set of input parameters. HLG takes a sequential approach to generating a layout and charge-map. HLG first assigns grippers to PMs and optionally, assigns nozzles of the assigned grippers to slots in a nozzle exchange unit which it then associates with particular PMs. HLG then packs feeders (tapes, stacks, trays, . . . ) into available space (slot(s)) on the feeder bars and packs optional tray stackers, honoring restrictions imposed by gripper assignments already made. HLG then assigns each individual part to a gripper (with the appropriate PM and nozzle type) and to a feeder (of the appropriate type within reach of the chosen gripper), and groups the parts into charges. Once the layout and charge-map are complete, a timing model is executed to calculate the merit measure(s), in this example, a resulting cycle time.

Although in principle any algorithm which can generate new solutions (in a parameter solution space) for testing by HLG can be used in conjunction with HLG, in practice, a parameter search algorithm should not be easily trapped by local minima and should be able to quickly identify and concentrate upon regions of the search space that are likely to contain plausible solutions. Genetic algorithms (GA) have both of these characteristics. In the configuration algorithm of the present invention, a variant of the GA, CHC is used as the parameter search algorithm.

The application of the method of the invention to a problem includes the following steps:

1. Create a machine readable file containing the parts list and a file containing problem descriptors representing a definition of the flowline or production line which may include, for example, the number and types of machines, preassignments of grippers, slots on feeder bars, feeders, etc., and constraints on machine hardware, etc. Also needed are machine readable files containing the definitions of all hardware (e.g., feeder types, feeder bar types, grippers, machines, package types, . . . ) available for the task at hand and constraints on the hardware if these exist, i.e., how the hardware may interact.

2. Run one-time code in a preprocessor portion of the HLG, which examines the given problem and computes problem-specific descriptors which are used by HLG.

3. Run the problem solver which includes CHC and HLG which work together to find layouts and charge-maps with low execution times. CHC treats parameter sets as chromosomes in a simulation of an evolutionary search for high performance sets. HLG serves as an evaluator of a "fitness" of each chromosome.

One-time Code: Certain tasks are performed once upon task initiation in the present invention. The tasks may include reading in information defining the problem to be solved and computing a number of task descriptors that will be used repeatedly while searching for a good solution. After reading in the parts list that defines the PCB to be assembled and the files defining the production line and hardware available, the one-time code computes an accommodation matrix. An example accommodation matrix for a particular PCB is shown in Table 1.

TABLE 1

An example accommodation matrix

| | | | PPU: | | | | | |
|---|---|---|---|---|---|---|---|---|
| | | | PIP | LPIP | LVPIP | VPIP | VPIP | LPIP | LPIP |
| | | | | | | noz: | | | |
| pkt | p_types | n_parts | N1 | N1 | N1 | N5 | N6 | N5 | N6 |
| 0402 | 18 | 56 | 1 | 1 | 1 | 0 | 0 | 0 | 0 |
| 0603 | 8 | 150 | 1 | 1 | 1 | 0 | 0 | 0 | 0 |
| QFP100 | 11 | 12 | 0 | 0 | 0 | 1 | 1 | 0 | 0 |
| SO16 | 6 | 6 | 0 | 0 | 0 | 1 | 0 | 1 | 1 |

For this example accommodation matrix, a row exists for each package type (pkt) to be placed on a given PCB. A package type is a designation known in the industry that defines external dimensions of the plastic envelope of a chip and the properties of the packaging that determine tooling requirements for picking and placing; however, this designation does not generally define electrical properties of the circuit element inside. For the example of Table 1, the first column of the accommodation matrix lists the package type under the heading pkt, for example 0402, 0603, QFP100, and SO16. The second column, p_types, is the number of different part_types of that package type, where each part_type is a specific type of circuit element (say a 5 Ohm resistor). The third column, n_parts, lists the total number of parts of the package type required. The remaining columns define the grippers available for the task where a gripper includes a phi placement unit (PPU) and a nozzle (noz). In this example, in the body of the accommodation matrix, a "1" indicates that the gripper (PPU and noz) of that column can handle the row package type; a "0" indicates that it cannot.

Using the accommodation matrix, the one-time code determines a composition of "phantom grippers" or phantoms for the given task. A phantom gripper, or phantom, is a set of grippers that are to some extent interchangeable for handling a set of package types. In the example of Table 1, two phantoms are present: a first one (phantom 1) including the three grippers using the N1 nozzle and the three different PPU types, (handling the 0402 and 0603 package types) and a second one (phantom 2) including the grippers using N5 or N6 nozzles and the VPIP and LPIP type PPUs. Note that the interchangeability of grippers within a phantom may be complete (e.g. phantom 1) or not (phantom 2); however, interchangeability between phantoms, is not present. Use of phantoms represents a way to partition the task into sub-tasks.

Two problem descriptors are then computed for each phantom: an estimate of minimum feeder bar space needed and an estimate total pick-and-place workload. The minimum feeder bar space needed is estimated a different way for FCM and ACM machines. On the FCM, feeder bars are short, allowing a limited number of ways feeders can be placed. By examining geometries of the feeder bars and the feeders available, the one-time code computes all the unique ways the feeders can be packed onto the feeder bars. Using these packings and a requirement that, at a minimum, a feeder must be available for each part type, a linear programming problem can be defined and solved to determine the minimum number of each feeder bar type needed on FCMs for each phantom.

On ACMs, the feeder bars are generally longer than those on an FCM. A simple sum of widths of the feeders needed gives a reasonable estimate of minimum feeder bar space needed on ACMs for each phantom.

Pick-and-place workload is also considered. The pick-and-place workload can be estimated conservatively (i.e. a lower bound) on the FCM by summing round trip travel times (from pick to place and back to pick position) for each part, since FCM PMs pick and place one part at a time. These estimates are generally more complex for ACMs. Nevertheless, conservative estimates can be made for various segments of the motion of the ACM head for each part including: move to pick location, move to camera align location, move to fiducial marks, move to coplanarity checker, move to place location, move to nozzle exchange unit to remove current nozzle and pick up new nozzle, and move to next pick location among others.

These pick-up-place work load estimates are computed by one-time code and saved for later use when building charge maps. They are combined in different ways depending on whether the charge is placing one part alone or is picking and placing two parts in tandem. For example, as previously discussed, a first part could be picked, then a second part could be picked, the manipulator would move to a CA location, then the first part could be placed and Lastly, the second part could be placed. Additionally, the manipulator could move to fiducial marks of the PCB before placing a part to insure correct location of the placement. Again, this time could be estimated.

Another problem descriptor computed in one-time code is PM desirability for each gripper type for each PM in the production line. PM desirability is a heuristic number representing a relative ability to do useful work if gripper G were assigned to each PM. This heuristic measure takes into account preassigned feeders on the feeder bars accessible to each PM, possible differences in PCB exposure to the PM because of the index stepping scheme (FCM) and preassigned nozzles in the accessible NEUs (ACM). PM desirability is computed by summing an "opportunity value" for each part handled by gripper G for each feeder bar slot on the PM for each index step. This opportunity value is described in Table 2a. When this precomputed PM desirability is used on an ACM, it is multiplied by a factor that reflects the availability of the chosen hole in the NEU. The highest applicable value is used from those listed in Table 2b.

TABLE 2a

The heuristic nozzle slot "opportunity" value

Given a slot (S) on a preassigned fbar (feeder bar), a PM, a gripper_type (G) and a part (P), return,
as the nozzle slot opportunity value:
  −B if S is preassigned a feeder preassigned only parts not covered by G
  0 if S is BLOCKED to P
  1 if S is empty and P's feeder_type will fit (for TRAY_STACKER, return 2 if PM & fbar on same end, else 1)
  B if S is preassigned P's feeder_type and there's a free pick (a pick position is available and can be used)
  2X if S is preassigned P's feeder_type and one pick is preasssigned P's part_type
  R is a ceiling of a ratio of number of parts covered by G whose part_type differs
  from P's part_type (pg) to the number of parts (n_parts) whose part_types are the same as P's
  R = ceil ((grippers[G].n_parts − part_types[pg].n_parts)/part_types[pg].n_parts)
  B is approximately the slots covered by P's feeder type plus one
  B = (int)((feeder_type.width * n_slots/fbar.width) + 0.5) + 1
  X = R * B
BLOCKED to P means:
  S is empty, but P's feeder_type won't fit, or
  S is unreachable, or
  S is BLOCKED by a feeder in a neighboring slot, or
  S is occupied by a feeder preassigned another part_type covered by G, or
  S is occupied by a feeder_type that cannot feed P TABLE 2b Attenuation values for PM desirability on ACM Machines

| | |
|---|---|
| 1.0 | for a preassigned nozzle on the correct side |
| 0.8 | for an empty slot on the correct side |
| 0.6 | for a preassigned nozzle on the wrong side |
| 0.4 | for an empty slot on the wrong side |
| 0.0 | if nothing is available |

For the ACM Machine, each PM is associated with a side of the machine and its respective feeder bars, to which it is closest (correct side). The other side which is farther away, is considered the wrong side.

The Genetic Algorithm (GA) or CHC for the present example and the general workings of CHC are described in detail in a paper published by L. J. Eshelman which appeared in Foundations of Genetic Algorithms, edited by Gregory Rawlins and published by Morgan Kaufmann, San Mateo, Calif. (1991) and presented at a meeting in Bloomington, Ind., Jul. 15–18, 1990, the paper entitled "The CHC Adaptive Search Algorithm: How to Have Safe Search When Engaging in Nontraditional Genetic Recombination" (hereinafter, Eshelman "The CHC Adaptive Search Algorithm"), and the contents thereof are herein incorporated by reference. Further, the workings of the modified genetic algorithm (GA) or CHC is described in detail in Eshelman et al., U.S. Pat. No. 5,390,283.

In the present invention, genes parameters) represented by bits or sets of bits of a chromosome string and which guide or control how a layout and a charge map are generated for controlling machine operation and which generally are machine dependent, are important aspects of the invention.

Figure 5:
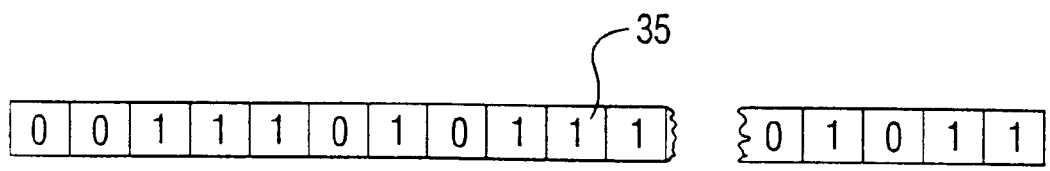
FIG. 5 is an example of a chromosome used by the method of the present invention.

While the chromosome or parameters of FIG. 4 can take any form, for simplicity it is usually in the form of a bit string 35 of ones and zeros, shown schematically in FIG. 5. The bit string 35 is made long enough so that sequential groups of bits can unambiguously be used by the HLG to generate a specific machine configuration. In this example, the chromosome layout is as follows, although clearly, one skilled in the art could modify the chromosome or create a new chromosome. chromosome format: all values are initially randomly assigned the present example. If a feasible solution is not found, the HLG returns a numeric value, heuristically determined, that should reflect how close the HLG came to finding a feasible solution. This heuristic value is chosen so that all feasible solutions should score lower (better) than all infeasible ones, and that among infeasible solutions, those closer to feasibility score better.

The charge map generator, HLG, executes a program having an algorithm that uses the following steps and parameters to generate a layout and charge map. The terms "charge map generators" and "heuristic layout generator" refer to the algorithm HLG because that algorithm generates both a layout and charge maps.

Step 1: Assign grippers to PMs and/or nozzles to slots if nozzle exchange unit are being used;
Step 2: Assign feeder types to feeder slots;
Step 3: Assign parts to charges which include which gripper and feeder are to be used; and
Step 4: Run timing model to produce merit measures.

Each step makes irrevocable decisions, possibly guided by parameters in the chromosome (steps 1–3), employing heuristics and using proxy performance measures. In addition, certain assignments may be preset by a user if desired. For example, certain grippers may be assigned to specific PMs, certain components to a trays in specified slots in tray stackers, or certain components to feeders in specified slots. The operation of each step will be described in enough detail so that one skilled in the art may see how the principles are applied.

Step 1: Assign grippers is now described. Pseudo code for this step (the routine is called assign_grippers) is shown

```
for each phantom
    if there are ACMs
        4 bits fbar_share_weight
    if bar_choice not forced (for example, bar choice is forced if all parts go on trays or
    parts only go on one feeder bar type)
        4 bits feeder bar weight for each feeder bar type
    if more than 1 feeder_type
        4 bits feeder type weight (one per feeder type)
for each gripper type
    4 bits PM weight
    1 bit PM preference bit
    2 bit target_fudge bit (one time code makes estimates based on pick and place
    workload - those estimates are used; however, GA may fudge these estimates to
    develop a more, optimal solution)
for each ACM machine
    n bits for NEU_ceiling (n is determined by examining each ACM - how many free
    NEU slots are on the NEU, taking into account preassigned slots)
for each part_type not already specified to be placed by a specific machine
    2 bits for machine_type (ACM, FCM, or other)
1 bit for each ACM feeder bar (zig zag bit)
4 bits for sort option (5 for combined products)
4 bits for sort_bits (ascending/descending) (5 for combined products)
1 bit for each part (possibles_choice) (if bit is "set" will try to conserve feeders by not giving
away a new feeder, if not, will not try to conserve)
```

The task of the HLG is to produce a complete feasible solution to a layout problem if it can. If it succeeds, cycle time for the solution found is returned to the GA or CHC in below (H1 and H2 refer to heuristics explained below) in Table 3:

TABLE 3

Pseudo Code for Assign Grippers

```
assign_grippers
    determine number_of_grippers_to_assign =
        number of FCM PMs +
        for each ACM
```

TABLE 3-continued

Pseudo Code for Assign Grippers

```
   number of NEU (Nozzle Exchange Unit) slots to use (determined by the
chromosome)
WHILE(number_of_grippers_to_assign > 0)
{   Compute the desirability of each gripper (H1)
    For the most desirable gripper,
        compute the desirability of each PM
        and NEU slot not yet assigned (H2)
    Assign the most desirable gripper to the most desirable PM
        placing the respective nozzle in the most desirable NEU slot if it's an ACM PM
        tally phantom fbar shares (H3)
    decrement number_of_grippers_to_assign
}
```

The desirability of each gripper (heuristic H1), is computed two-different ways corresponding to two different phases of assign_grippers' operation. Each gripper has a gripper type. In phase one, assign_grippers tries to establish minimum conditions for a feasible layout. This means that every gripper_type has access to sufficient feeder bar space that at least one feeder can be accommodated for every part_type needed. This is accomplished by computing an estimated feeder_bar_shortfall (the difference between the minimum feeder bar space needed (computed in one-time code) and the amount currently assigned) for each nozzle and updating these estimates as each assignment is made.

Each nozzle's desirability is a product of the feeder_bar_shortfall (neediness) and a chromosome-supplied weigh (greediness). Greediness is supplied by the chromosome, with the GA learning a value for this variable. Once all feeder_bar_shortfalls are zero, indicating feasibility is enabled, phase two begins in which assign_grippers tries to establish an allocation of grippers that enables optimal leveling of the workload. For this, each gripper has a target number of PMs. The target is a number precomputed in one-time code and reflects estimates of pick-and-place workload, but it is modified by genes from the chromosome (target_fudge bit) (possibly adding a small increment). This allows the GA to compensate for poor estimates.

Once a gripper is selected, the most desirable PM is selected (heuristic H2). In one-time-code a basic desirability is computed for each gripper for each FREE PM (pipette modules not assigned a specific nozzle). The basic desirability can be attenuated by chromosome-supplied weights that allow the GA to "encourage" assignments towards PMs that have access to feeder bar types which the gripper currently "needs" (depending on feeder_bar_shortfalls).

Heuristic H3 tallies feeder bar shares for each phantom. On ACMs, phantoms can "share" feeder bars. Feeders for two or more phantoms (called Contending Phantoms) are placed on feeder bars which can be reached by nozzles belonging to those phantoms. A needy phantom can take the entire feeder bar space (prime, reachable areas) not leaving enough feeder bar space for its co-sharing but less demanding phantoms. No reasonable combination of feeder weights may be able to overcome this tendency. Therefore, to overcome this tendency, contending phantoms are considered together and "neediness" is determined in comparison with members of the group. A minimum space needed is reserved and allocated before extra space is given away to the most greedy phantom.

Figure 6:
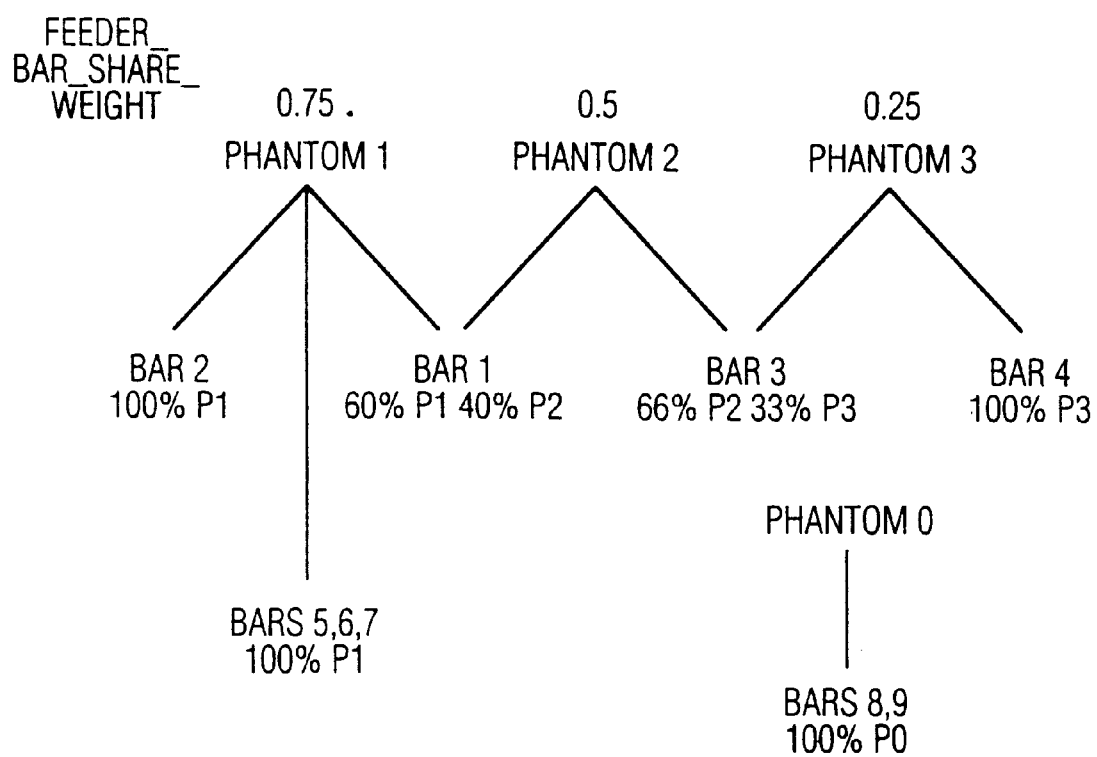
FIG. 6 is an example of phantom bar shares.

Each of the contending phantoms gets a prorated share of the feeder bar based on the respective fbar_share_weights, referred to as total_bar_space-allowed for the respective phantom. A fbar_share_weight is assigned for each phantom in this example, in 4 bits of a gene, representative of how "aggressive" a phantom is. For each bar, the bar_share_weights of the phantoms sharing the bar are summed. Each phantom is then given a percentage of the feeder bar based on its percentage of the summed fbar_share-weighs. This concept is illustrated in FIG. 6, which provides an example of phantom bar shares for an combination of an FCM and an ACM machine.

In this example, Bar 1 is shared by Phantom 1 and Phantom 2. Phantoms 1 and 2 have been assigned fbar_share_weights of 0.75 and 0.5, respectively. These fbar_share_weights are summed for shared Bar 1: 0.75+0.5= 1.25. Each phantom is then given a percentage of the feeder bar based on its percentage of the summed fbar_share_weights. Thus, in this example, Phantom 1 is given (0.75/1.25)% =60% of Bar 1 and Phantom 2 is given (0.5/1.25)% =40% of Bar 1.

Feeder bars which are assigned exclusively to one Phantom, such as, in this example, Bars 2, 5, 6 and 7, are assigned 100% to the Phantom. Clearly, one skilled in the art could determine Phantom sharing for each feeder bar based on this example or other similar sharing.

In addition to bar sharing, another aspect of the ACM that required special inventions in this step different from those in the '283 patent include the nozzle exchange capability which called for genes to control the extent to which available NEU slots are utilized (NEU_ceiling) and special heuristics to include preassigned nozzles in NEUs in the gripper desirability calculus. In the present embodiment, nozzles in the NEU may not migrate, i.e., each is committed to be used by only a single PM. This imposes an unnecessary restriction on the flexibility of which the ACM is capable. A scheme to relax this restriction involves introducing an additional gene for each NEU slot that specifies that the nozzle therein may: not migrate (one allele), may migrate between PMs on the same side of the ACM (a second allele), or may migrate to any PM on the machine (a third allele).

Another aspect of the current embodiment which differs from that described in the '283 patent is the relaxation of the requirement that feeder bars not be preassigned unless nozzles were also preassigned. This required modification of the assign_grippers function as described above, including more elaborate tracking of preassigned feeders, since it may be unknown at problem initialization which gripper will access each feeder.

Through the information acquired by the one-time code, a gripper can be preassigned to a PM. By convention in the preferred embodiment, a nozzle preassigned to an ACM PM will not be changed with one in a NEU. In addition, the present embodiment will not recognize the PM to which the nozzle is preassigned as being free to have any other nozzles assigned to it. More specifically, nozzles preassigned to PMs are considered permanently fixed. If a PM does not have a preassigned nozzle, the present invention can make use of all possible preassigned or unassigned slots in a NEU. This gives the user a certain control over the layout the present invention win consider. Clearly, one skilled in the art could alter this to allow for different conventions.

Step 2: Assign feeder-types will now be discussed. Pseudo code for this step (the routine is called assign_feeder_types) is shown below (F1, F2 and F3 refer to heuristics explained below) in Table 4. In Step 2, empty feeders are assigned to bars unless the feeders and/or part-types are already preassigned by the user; in which case it properly accounts for these preassignments. Feeder_types may include sticks, trays and tapes. Feeder bar types include feeder bars and tray stackers.

TABLE 4

Assigning feeder types.

```
assign_feeder_types
  For each feeder group (F1)
    WHILE (feeder_bar_space_available > 0)
    {  Compute the desirability of each phantom (pi) (F2)
       For the most desirable phantom (pbest),
         compute the desirability ofeach feeder_type (F3)
       Choose a slot/pick combination on a feeder bar assigned to the phantom(pbest)
         in Step 1 (F4)
       Assign the most desirable feeder_type to the most desirable slot/pick and tally it to the
         respective phantom (pbest)
       Update feeder_bar_space_assigned (pbest) = feeder_bar_space_assigned (pbest) +
         width of the feeder assigned
       Recalculate flowline feeder_bar_space_available = feeder_bar_space_available -
         width of the feeder assigned
```

The heuristic F1 classifies the different feeder types into "groups" based on the part types specified in the part list and fixes a specific order for processing these groups:

GROUP 1 preassigned feeders (by the user) which are at least partially empty

GROUP 2 feeders for part types that are constrained by the user to go on FCMs

GROUP 3 feeders for part types that need TRAY type feeders

GROUP 4 feeders for part types that are constrained by the user to go on ACMs

GROUP 5 Specialist feeders that will go on only one Feeder Bar Type

GROUP 6 Generalist feeders that will go on more than one Feeder Bar Type

GROUP 7 The set of all feeders

Clearly, one skilled in the art could alter this to assign feeders based on part types' package types where the feeder is not explicitly specified. Heuristic F1 regulates the order in which the available space on all the feeder bars is used up in the process of assigning feeder types. Heuristic F1 prevents the algorithm from "painting itself into a corner" by ensuring that constraints placed by the user are honored and that feeder_types that are given a higher desirability by the chromosome (see Heuristic F3 as explained below) do not preempt less desirable feeder-types.

Heuristic F2 selects the most desirable phantom to give feeder bar space. Phantoms, as discussed earlier, are determined based on the parts list. Pseudo code to determine the desirability calculus is shown in Table 5:

TABLE 5

Pseudo Code for Selecting Most Desirable Phantom

```
Given the set of phantoms (p1, p2, . . . , pn).
  that contend for a set of feeder bars (f1, f2, . . . fm)
  based on the assignment of grippers to PMs in Step 1 (H3)
For each phantom in the contending set (pi) determine the
  desirability = total_bar_space_allowed (pi) from H3 -
    feeder_bar_space_assigned (pi)
Select the phantom (pi) with the maxinium desirability
```

Heuristic F3 selects the best feeder type to place based on FT (feeder_type) weight (Feeder_Wt(fi)) specified by the chromosome. The desirability calculus is as shown in Table 6:

TABLE 6

Pseudo Code for Best Feeder Type Desirability Calculus

```
For Feeder Type fi, Feeder_Group_gi
  If(n_picks_assigned < min_picks_needed)
    desirability (fi) = 1.0 + Feeder_Wt(fi) *
      (min_picks_needed - n_picks_assigned)/
        min_picks_needed
  else
    desirability(fi) = Feeder_Wt(fi) *
      (max_picks_possible_on_flowline - n_picks_assigned)/
      (max_picks_possible_on_flowline - min_picks_needed)
Select the Feeder type with maximum desirability
```

Heuristic F4 selects the best slot/pick 84 on a feeder bar 83 on which to place the next feeder type. The desirability is designed to spread the feeders 85 as much as possible between feeder bars 83 but pack them as tightly as possible within a given feeder bar 85. Slot_i is the slot for which desirability is being determined.

Figure 7:
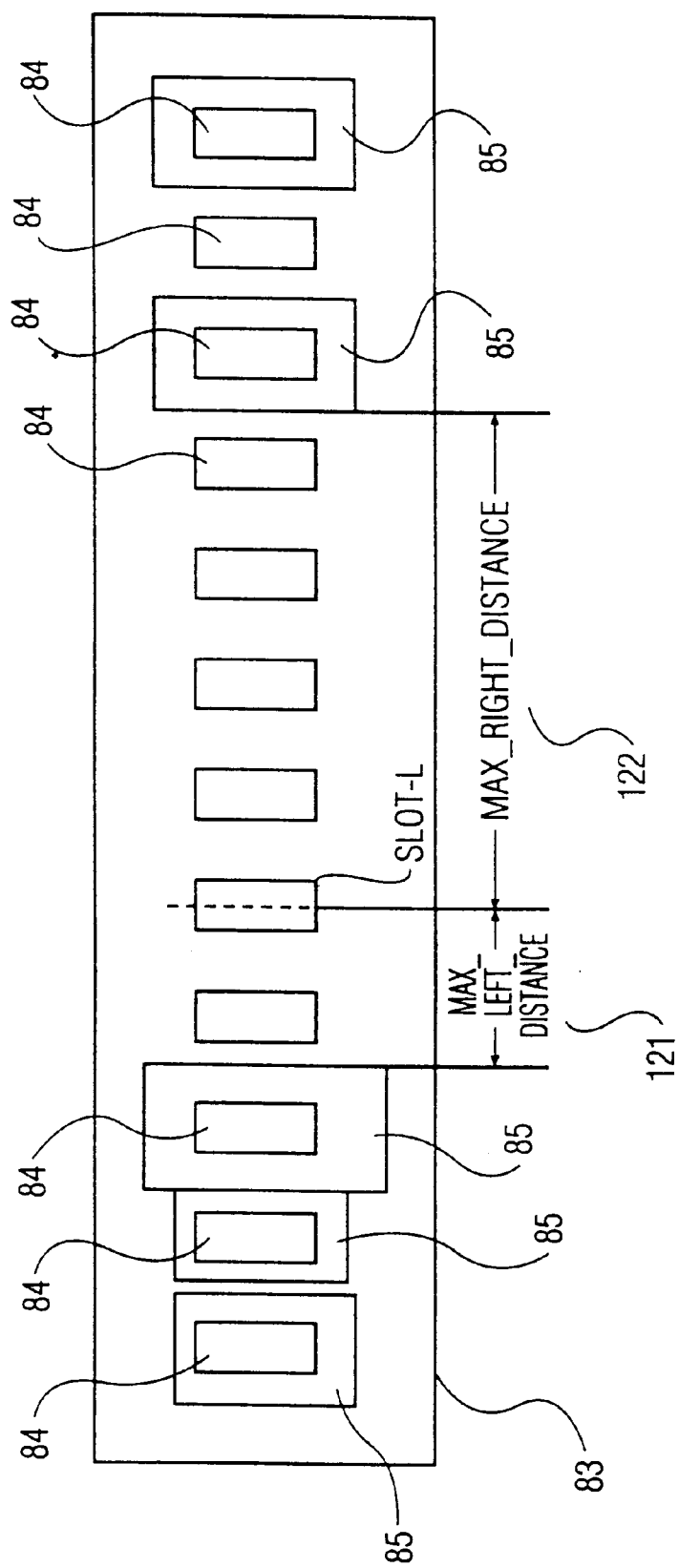
FIG. 7 is an example of a feeder bar hag slots.

FIG. 7 illustrates an example of a feeder bar 83 hang slots 84. Each feeder bar 83 has at least one slot 84 for accepting a feeder 85. Also shown are examples of max(left_distance, right_distance).

The desirability calculus is as shown in Table 7:

TABLE 7

Pseudo Code for Desirability Calculus for Slots

For BAR type Feeders:
  For FCM Bars:
  desirability (slot_i) = max (left_distance, right_distance)
  where left (or right) distance = distance from the left (or right, respectively) edge of
  the feeder at slot_i to the next feeder on the left (or right, respectively) side or the
  edge of the feeder bar, whichever comes first
  For ACM Bars:
    if (slot_i is reachable by the gripper)
      desirability (slot_i) = time_to_CA
    else
      desirability (slot_i) = 0
  where time_to_CA = time taken to move the gripper from the slot to the CA camera
For TRAY type Feeders:
    if (slot_i is reachable by the gripper)
      desirability (slot_i) = lower_distance * Wt1 + time_to_CA * Wt2
      where Wt1 and Wt2 are constants designed to make a first term
      (lower_distance * Wt1) one order of magnitude larger than the second
      term (time_to_CA * Wt2)
    else
      desirability (slot_i) = 0
  where lower_distance = distance from the bottom edge of the tray
    feeder at slot_i to the next tray feeder below it ON THE SAME PICK
    (left or right, pick on a pallet) or the edge of the feeder bar, whichever comes
    first
If the chromosome bit "zigzag" bit is turned on for a particular
  tray stacker, then modulate the desirability to encourage a zigzag assignment of trays,
  otherwise, modulate it to assign trays in a "out" to "in" or columnar pattern with
  respect to, pipette module reachability As shown in FIG. 7, left_distance 121 and right_distance 122 are determined for each slot for which desirability is being determined. For a feeder bar of an ACM, the time to move the gripper to the CA 95 (time_to_CA) is considered.

Figures 8A, 8B:
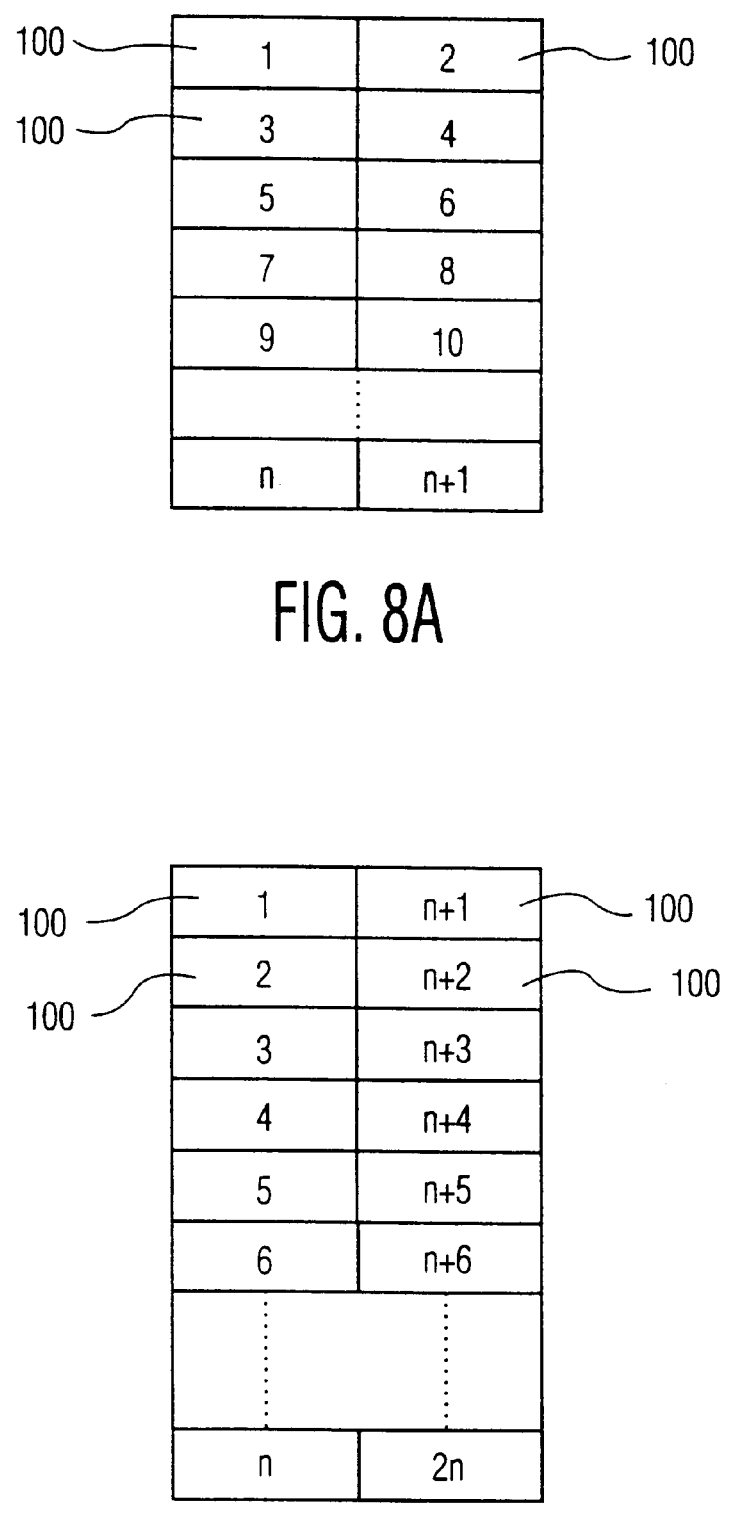
Figure 8C:
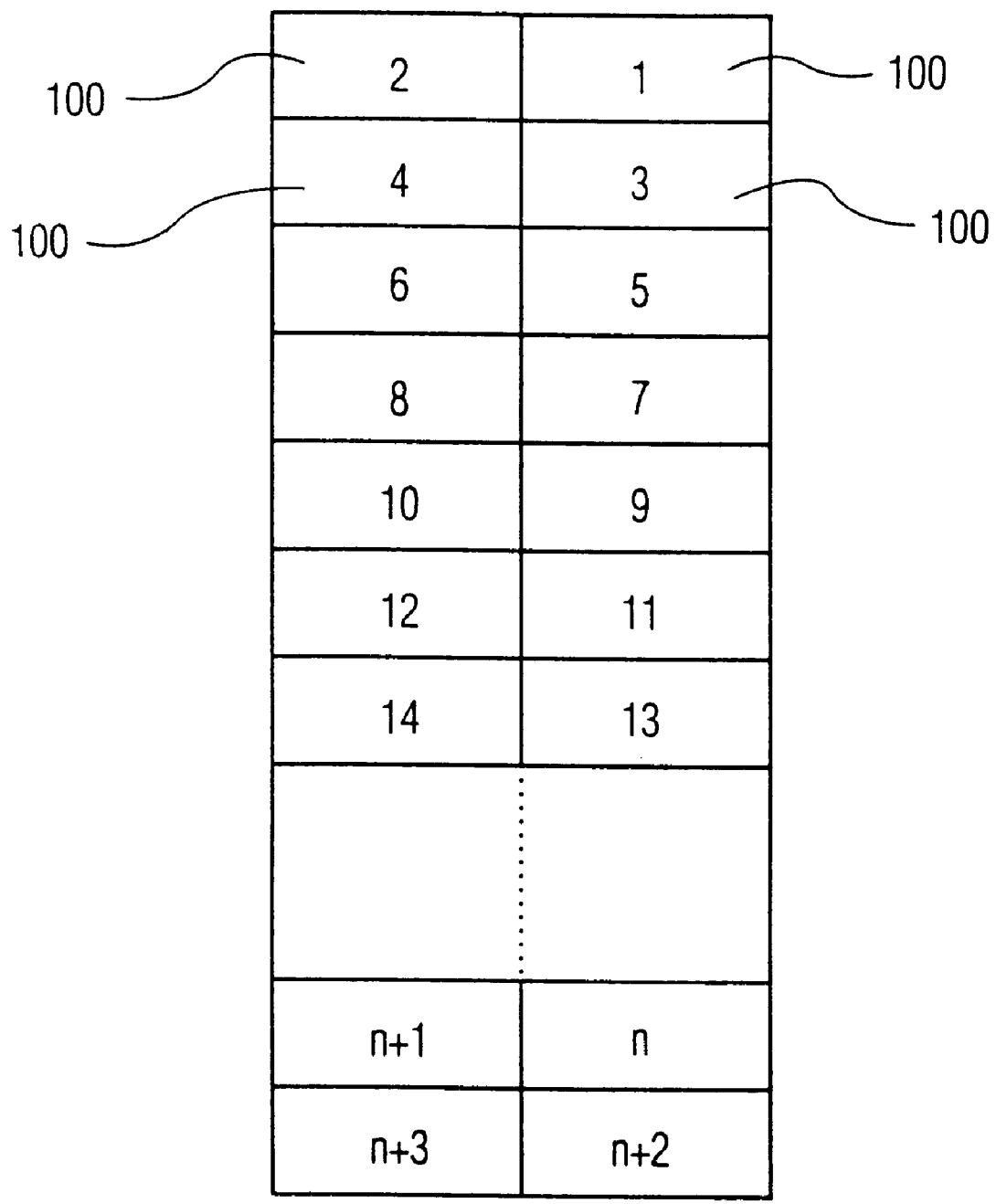
FIG. 8C illustrates a second zig-zag pattern of tray assignment to pallets.

Assignment of trays 100 to pallets may be in either a zig zag pattern as shown in FIG. 8A or a columnar pattern as shown in FIG. 8B. In FIG. 8A, trays 100 are assigned in a zig zag pattern as indicated in increasing numerical order. In FIG. 8B, trays 100 are assigned in a columnar pattern as indicated in increasing numerical order. Those tray assignments shown are for, in this example, access by a left gripper due to the construction of the tray stacker. If the tray stacker were placed for access by a right gripper (generally on the right end of the ACM machine, for example), then the tray assignments would be mirrored those shown in FIGS. 8A and 8B. For example, FIG. 8C illustrates tray assignment for a zig-zag pattern.

A zig zag bit is added to the chromosome to indicate whether a zig zag pattern should be followed when assigning trays to pallets or levels on the tray stacker when, as in this example, each pallet has at least two trays. Another alternative is to have a columnar assignment of trays. Alternative patterns for assigning trays helps in situations where tray assignment is complicated by reachability considerations. Clearly, other patterns could easily be followed and developed by one skilled in the art.

Due to inaccuracy inherent in the estimation, assign_feeder_types has a mechanism to raise the minimum for a particular phantom should the CHC algorithm find it exceedingly difficult to find a feasible solution in Step 2 for a particular phantom.

Step 3: Level is now discussed. Pseudo code for this step (a routine called level) is shown below in Table 8 where L1 and L2 refer to heuristics explained below. The concept of a bucket is inherited from the '283 patent and refers to a quantum of time-space. On the FCM, a bucket is assigned for each PM-index step combination. A bucket may be thought of as an interval of time during which each PM may place parts. A goal of a balanced line will be approached as the amount of pick-and-place work done by every PM during each index step approaches the same amount. Since the ACM has no index stepping, there is one bucket for each ACM machine. Each FCM bucket has one opportunity to become a "possible" (provided certain conditions are met as described below.) However, because the ACM has multiple PM's and potentially even more nozzles, each eligible combination can be a "possible."

TABLE 8

Pseudo Code for level level
  sort the parts as directed by the chromosome
  while (there are parts to place)
    select the next part on the list
    find all "possibles" (L1)
    if no "possibles" exist.
      return(parts remaining to place)
    select a possible (L2)
      for an ACM "possible", further select
      -- the closest available feeder to the CA (or an existing feeder)
      -- point of insertion of part in charge map
      -- which nozzle and if a nozzle exchange is needed
      -- pick sequence, place sequence, and fiducial imaging sequence
    place the part in the chosen "possible"
  return (zero)

The sorting of parts under chromosome control, by and large, occurs as described in the '283 patent. However, a significant additional functionality is controlled by the machine_type genes. With more than one machine type in a production line, the user must specify for each part which machine type shall be used to place it. In the current embodiment, there are three choices: A, F, or E, where A specifies that the part must be placed by an ACM machine, F specifies FCM, and E specifies that either machine type may be used. The one-time-code identifies the E parts, if any, and creates a gene in the chromosome for each one called the machine_type gene. At present these genes have four alleles (two bits): one for ACM, one for FCM, and two for either, although clearly, additional machines may be added. When the list of parts is sorted, and if the machine_type_genes are used, then the major (first) sort field is the machine types. Experience has shown that this approach tends to yield superior solutions than not doing so most of the time. An exception is when the production line has many preassignments of nozzles and or feeders. These are likely to constrain the feasible choices of which machine type to use and so in these cases the machine_type_genes are not used.

Conditions (L1) for a bucket to be eligible for placing a part, i.e., to become a "possible" are:
—An appropriate nozzle must be available (either preassigned to one of the PMs or assigned by Step 1 in the NEU),
—An appropriate feeder type or tray must be available (either free, assigned by Step 2, or assigned to the right part type). The decision of which feeder to employ is also made in the FCM case, but the choice is much simpler due to its structure. On the ACM, there may be two feeder bars or tray stackers, or a combination, to choose between. Of the set of all free feeders, the one closest to the camera (shortest pick travel) is chosen.

In a manner analogous to that used in the '283 patent (L2), a simple greedy algorithm selects the possible where adding the given part will make the minimum impact on the line heartbeat time. This selection may, under chromosome control, be from all eligible possibles or only from among those where a feeder already committed to the required part type is available. Note that the possible comparisons may include FCM as well as ACM possibles.

In an FCM possible or bucket the "impact on the line heartbeat time" is a simple calculation because an FCM PM places one part at a time. An FCM bucket includes a list of parts and for each part the round-trip time to pick and place the part. These times (which are calculated in one-time code) can simply be added together to come up with the total time for the bucket. The "impact on the line heartbeat time" of adding one more parts to the possible is machine_slack plus bucket_slack minus the round-trip time to pick and place the part. The ordering of parts in the bucket has little or no impact on the possible total time. Bucket_slack is a difference between heartbeat time and bucket time needed to do its work (FCM). Machine_time is a sum of all heartbeats (FCM) or charge map execution time (ACM). Machine_slack is the respective machine's machine_time minus a slowest machine time.

Figure 9:
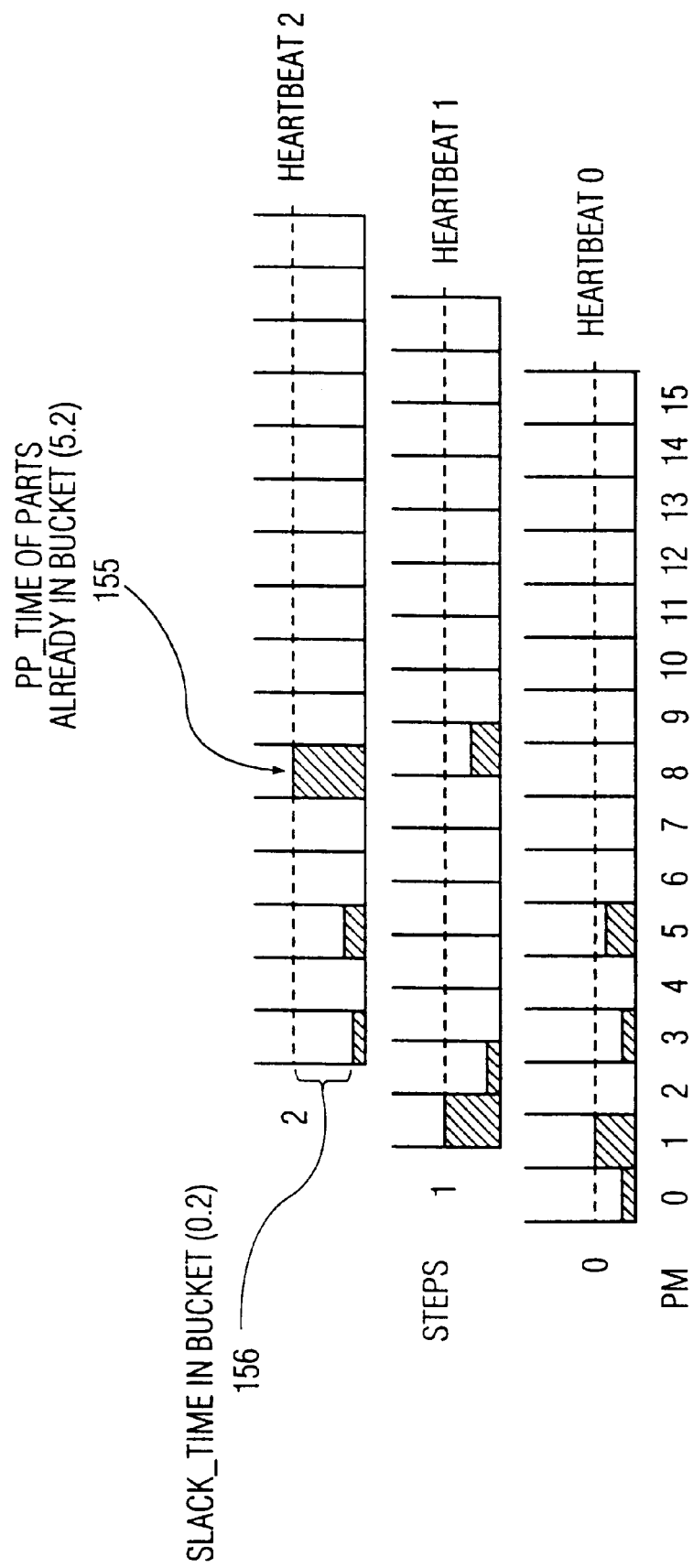
FIG. 9 is an example of a possible or bucket concept for an FCM.

FIG. 9 illustrates an example of buckets on an FCM, some of which are "possibles". Each step represents a period of time or each index step, when each PM (in this example, 0–15) may place parts. Some parts have already been assigned to some buckets. For example, in step 0, PMs 0, 1, 3, and 5 all place parts resulting in a heartbeat indicated by heartbeat 0. A heartbeat represents the maximum time for part placement of parts assigned to the slowest PM in the line. For this example, in step 2, PM 5 has been assigned placement of parts which require the most time for placement with respect to the other PMS. Heartbeat 2 indicates this maximum time. Slack time in bucket (0,2) indicates the free time that PM 0 has in step 2.

All buckets and possibles in a same index step share a same heartbeat time or execution time of the slowest PM. A true cycle time must account for movement of the transport system and movement of the grippers between pick positions, but can deduct gripper movement times that occur simultaneously with transport movement. Balance between all possibles is desired. This is further discussed in patent '283.

In contrast, ACMs often pick up more than one part at a time before moving to place the parts. Further, additional features, such as performed by various parts of the vision alignment system, require additional time. Unlike the FCM, ACMs are given one charge map for the entire machine. Pseudo code for computing the desirability of an ACM possible is shown below in Table 9. A1 and A2 refer to heuristics used to make the associated decisions.

TABLE 9

Pseudo code for computing desirability of ACM possible

Given a part and an ACM PM
   for each compatible nozzle assigned to this PM
     for the most desirable slot on either fbar (A1)
       compute possible desirability (A2)
       retain it if it is best ACM PMs can access two feeder bars (fbars) or tray stackers, but a compatibility check with the part is performed before trying to select a slot. The desirability (A1) of each slot is a precomputed (in one-time code) value called slot_travel and is the travel time to the CA 95 by the given PM 106, provided a compatible feeder is available in the slot. In this case, the smallest number is the most desirable, with preference being given to a feeder that may already have been assigned the appropriate part type.

"Possibles" desirability (A) is an estimate of machine_slack minus the amount by which the charge-map execution time would be increased if the part were placed by the given PM. The ACM charge map includes charges. Each charge includes one or two parts picked from the front or rear side of the ACM machine.

Pseudo code of heuristic A is shown below in Table 10, also determines the most desirable position in the charge map for a given part. A new part could include a new one-part charge in the charge map or could be paired with an existing one-part charge to create a two-part charge. This is done given constraints on the swapping in and out of nozzles needed for this part and of sequencing of pick and place actions.

TABLE 10

Pseudo code of Heuristic A2

Given a part and an ACM PM, feeder slot and nozzle index
  Check if the PM/nozzle combination is already used in the charge map
    If so jump to the first charge that uses that PM/nozzle combination
    If not, jump to the first break point (i.e., where the initial nozzle is first swapped out of this
      PM) and subsequent break points (where subsequent nozzle swaps occur).
        * the previous nozzle (if any) on this PM must be returned to its slot and the
        new nozzle must be picked up : a nozzle exchange penalty is incurred.
  Loop through the list of subsequent charges

TABLE 10-continued

Pseudo code of Heuristic A2

```
Check if this is a compatible one-part charge
    -- the "other" PM is used for the existing part
    -- the existing part is picked from a feeder on the same "side"
If compatible, determine the time effect of making this a 2-part charge
    * effect on the next charge in the charge map.
    * effect of an optimized pick sequence, place sequence and fiducial
      imaging sequence to use in the two part charge
    * if the first part is fed on trays or on programmable index feeders, account for
      the tray exchange or feeder indexing
If not compatible, determine the time effect of inserting a new 1-part charge
    * effect on the next charge in the charge map.
    * if the part is fed on trays or on programmable index feeders, account for the
      tray exchange or feeder indexing
If the nozzle/PM combination has not been used in the charge map compute the time penalty
    * of picking up the nozzle
    * creating a one part charge and inserting it or appending it to the charge map
```

Heuristic A2 is designed to have the following effects; however, these are not, in this embodiment, explicitly programmable into Heuristic A unless otherwise noted.

a) A charge map is a sequence of charges where each charge includes, in this example, one or two parts picked and placed by PMs on the same "side" of the ACM. In general, a timing model of the charge map favors construction of two-part charges where both PMs pick up parts, have them aligned at the CA unit, check fiducial marks, and place parts. (The sequence within a charge map may vary, i.e., a coplanarity unit may be visited before a part is placed.) Under some circumstances, however, based on the criteria sought to be optimized, one-part charges may be better.

b) Consecutive charges in the charge map tend to pick from opposite "sides" of the ACM to minimize travel. Under some circumstances, however, based on the criteria sought to be optimized, same side charges may be better. p1 c) Following a "pick up" of a nozzle from the NEU by a certain PM a series of charges are created where parts are picked and placed using that nozzle. Eventually that nozzle may be "swapped out" and a new different nozzle may be "swapped in" by the PM. In the present embodiment, a restriction built into the heuristic for minimizing nozzle exchanges is that a nozzle once swapped in by the PM, used to pick parts, and then swapped out will not be swapped in again later in the charge map. Clearly, one skilled in the art could modify this restriction. Further, in the present embodiment, if same nozzle type is present twice or-more in the NEU, this restriction would not apply.

d) A two-part charge has a pick sequence and a placement sequence. Pick sequence defines a sequence in which parts are picked and similarly, place sequence defines a sequence in which parts are placed. An optimal pick sequence is determined by analyzing which produces a more desirable sequence, based in this example, on shortest time, by determining the timing of both alternatives (i.e., pick by PM1 followed by pick by PM2 and then on to the CA unit, and vice versa.) The shorter time of the two alternatives determines which sequence is chosen for "picking" for the particular charge. Similarly, the same analysis is performed for the placement sequence.

Figure 10:
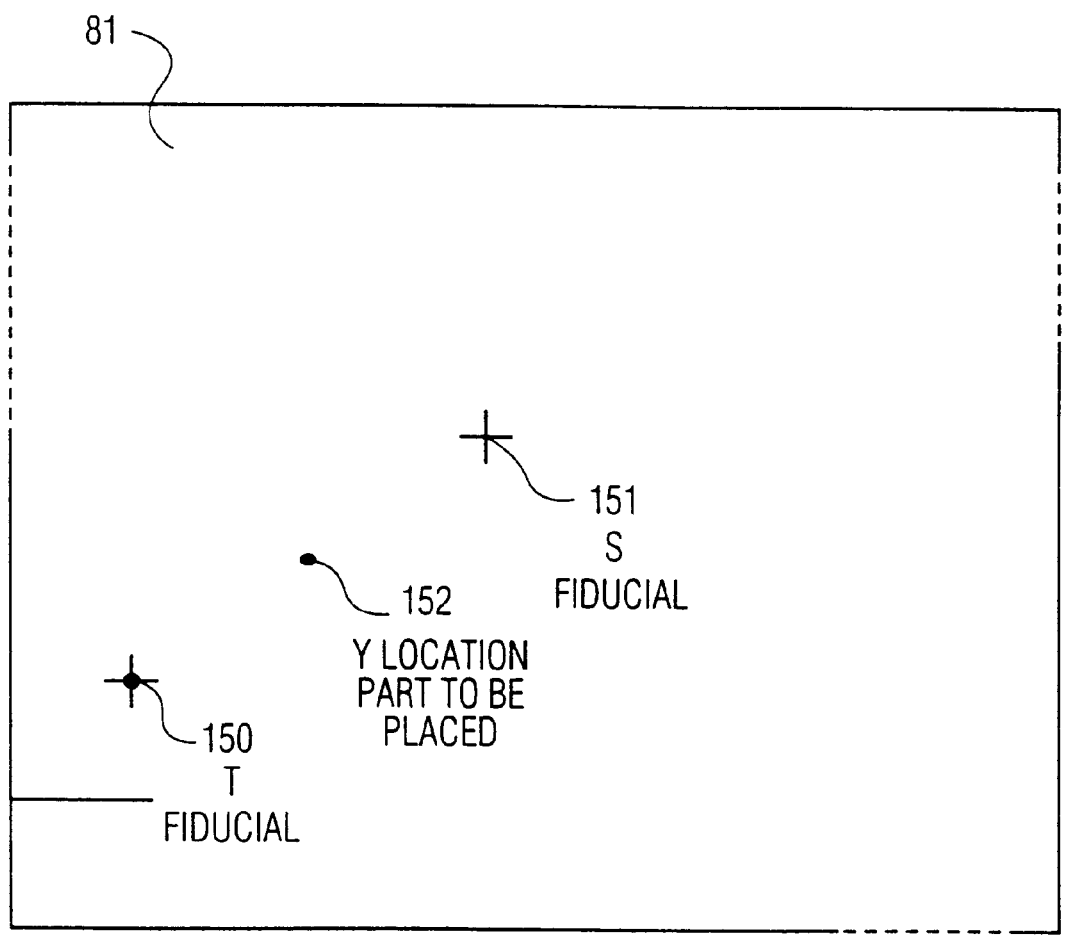
FIG. 10 illustrates an example of fiducial marks on a PCB.

A fiducial imaging sequence defines in what sequence fiducial marks are checked. Fiducial marks 151 and 152 are present on the PCB 81 as a means of providing information regarding the location at which the manipulator is. As shown in FIG. 10, fiducial marks may exist on various locations on the PCB 81. If a part is to be placed, for example, at location Y 153, the manipulator 80 (not shown) will move to a location so that an appropriate fiducial alignment (FA) pan 92 (not shown) may measure the global and/or local fiducial. In this example, the manipulator may be moved so that the FA part 92 may measure fiducial S 151 and then fiducial T 152 or vice-versa. Tis sequence is determined based on g execution time of the fiducial checking and parts placing actions and is one of the time estimates calculated in one-time code.

e) If delays due to tray exchanges require a PM to wait in place, a time penalty is added to the charge. This, in effect, discourages solutions where a tray needs to be exchanged while the PM waits. This is also true of tape feeders (generally large tape feeders) which involve significant tape index time.

These charges are then combined to form a charge map for each machine.

When prespecified criteria have been met, an optimal or near optimal solution is developed as discussed in Eshelman, "The CHC Adaptive Search Algorithm."

The present invention thus produces optimized or near optimal layout and charge maps which will indicate to a user where to place component parts and grippers on a flowline so as to populate a PCB efficiently. We the invention has been described in connection with preferred embodiments, it will be understood that modifications thereof within the principles outlined above will be evident to those skilled in the art and thus, the invention is not limited to the preferred embodiments but is intended to encompass such modifications.

What is claimed is:

1. A method for generating a layout and charge maps of a flowline of component placement machines, the method comprising:
   a) creating an initial population of chromosomes, each chromosome representing a set of parameters that control how layout and charge maps are generated;
   b) generating problem descriptors based on one time code;
   c) searching parameters and generating trial solutions as chromosomes; and
   d) interpreting these chromosomes to generate the layout and charge maps using the problem descriptors, determining a merit measure for each generated layout and charge map and returning the merit measure for respective chromosomes to the adaptive searcher, the step c) further generates new chromosomes based on the merit measure and prior chromosomes, and the step d) further provides final optimized charge maps and a layout when prespecified criteria based on the merit measures are met.

2. A method as recited in claim 1, wherein the step d) further comprises:

assigning grippers to pipette modules; and if a nozzle exchange unit is present in any of the component placement machines, assigning nozzles to slots in the nozzle exchange unit.

3. A method as recited in claim 1, wherein the step d) further comprises:

assigning feeder bars to specific component placement machines;

assigning feeders to available slots on feeder bars;

if a tray stacker is present in any of the component placement machines, assigning pallets and trays to available slots on the tray stackers.

4. A method as recited in claim 1, wherein the step d) further comprises:

assigning each part to be placed on a printed circuit board, to a gripper of a plurality of grippers having an appropriate pipette module and an appropriate nozzle of a plurality of nozzles.

5. A method as recited in claim 1, wherein the step d) further comprises:

i) assigning grippers to pipette modules and, if a nozzle exchange unit is present in any of the component placement machines, assigning nozzles to slots in the nozzle exchange unit and associating each nozzle to a respective pipette module;

ii) assigning feeders to available slots on feeder bars and, if a tray stacker is present in any of the component placement machines, assigning pallets and trays to available slots on tray stackers;

iii) assigning each part to be placed on a printed circuit board, to a gripper of a plurality of grippers having an appropriate pipette module and a nozzle of a plurality of nozzles; and iv) calculating a merit measure.

6. A method for generating layout and charge maps of a flowline of component placement machines, the method comprising the step of:

a) pre-processing to create problem descriptors based on at least one file containing a parts list, a definition of the flowline, the flowline including multiple machines and different types of machines, and specifications of all hardware based on specific information;

b) problem solving including adaptive searching and heuristic layout generating, for finding layouts and charge maps meeting prespecified criteria.

7. A method as recited in claim 6, wherein the adaptive searching of step b) analyzes chromosomes based on initially randomly assigned chromosomes, and produces new chromosomes in a simulation of an evolutionary search for high performance sets.

8. A method as recited in claim 7, wherein:

the heuristic layout generating of step b) evaluates a fitness of each chromosomes and communicates at least one fitness value of each chromosomes for use in the adaptive searching; and the adaptive searching produces new chromosomes in response to the fitness values received.

9. A method as recited in claim 6, wherein:

the charge map specifies which parts are to be placed, by which gripper and in what order;

the file sets forth problem descriptors, for each part type, a package type and a number of those parts required to be placed;

the preprocessing of step b) produces an accommodation matrix based on the file produced by the preprocessor, the accommodation matrix setting forth nozzles, and phi placement units useable by each package type.

10. A method as recited in claim 9, wherein:

the problem solving of step b) determines a composition of phantom grippers based on the accommodation matrix;

problem descriptors are computed for each phantom gripper;

the heuristic layout generating of step b) comprises the further steps of:

calculating gripper desirability for each gripper in the flowline and assigning grippers to pipette modules;

analyzing feeder types and feeder slots and assigning each feeder type to a feeder slot;

assigning parts to charges including which gripper and feeder are to be used; and running a timing model to produce merit measures.

11. A method as recited in claim 10, wherein the step of analyzing feeder types includes:

establishing minimum conditions for a feasible layout; and establishing an allocation of grippers to enable an optimal leveling of workload.

12. A method as recited in claim 11, wherein establishing minimum conditions for a feasible layout comprises the steps of:

a) determining a number of grippers to assign;

b) determining for each gripper, a desirability of each gripper;

c) determining for a most desirable gripper based on the desirabilities determined, a desirability of each pipette module not yet assigned;

d) assigning the most desirable gripper to a most desirable pipette module including tallying feeder bar shares for each phantom gripper; and e) ascertaining that each gripper has been assigned.

13. A method as recited in claim 6, wherein prespecified criteria includes minimum placement times and at least one of: minimum feeders, and minimum amount of hardware.

14. A method as recited in claim 10, wherein the calculating includes performing desirability calculations to make gripper assignment decisions based on a minimum required feeder bar space.

15. A method as recited in claim 11, wherein:

at least one component placement machine includes a nozzle exchange unit for holding nozzles, the nozzle exchange unit having slots for holding nozzles; and the step of establishing minimum conditions for a feasible layout comprises the steps of:

a) determining a number of grippers to assign;

b) determining for each gripper, a desirability of each gripper;

c) determining for a most desirable gripper based on the desirabilities determined, a desirability of each pipette module not yet assigned;

d) assigning the most desirable gripper to a most desirable pipette module including tallying feeder bar shares for each phantom gripper; and e) ascertaining that each gripper has been assigned.

16. A method as recited in claim 15, wherein:

each feeder bar has slots and each gripper is one of a plurality of gripper types;

the calculating the desirability of each gripper includes:
summing a nozzle slot opportunity value for each part handled by a gripper for each feeder bar slot on the pipette module comprising the steps of:
determining for a given slot on a preassigned feeder bar, a pipette module, a gripper type, a part, and a status of a given slot;
calculating a ceiling of a ratio of a number of parts covered by the gripper whose part type differs from the given part's part type; and
calculating the nozzle slot opportunity value using the ceiling of the ratio the number of parts and a slot value representing an approximation of slots covered by the feeder type of the given part plus one.

17. A method as recited in claim 6, wherein the step of adaptive searching includes specifying to which machine type each part type is assigned.

18. A method as recited in claim 10, wherein the calculating includes performing desirability calculations to make gripper assignment decisions based on a prorated share of a pick and place workload each gripper can accomplish.

19. A method as recited in claim 10, wherein the calculating comprises the steps of:

computing a desirability of each gripper;

determining a most desirable gripper and a respective machine of the most desirable gripper, and computing a desirability of each pipette module not assigned and a desirability of each nozzle exchange unit slot not assigned, if a nozzle exchange unit is present on a component placement machine of the flowline;

assigning the most desirable gripper to the most desirable pipette module, placing a respective nozzle in the most desirable nozzle exchange unit slot, if a nozzle exchange unit is present on the respective machine; and tallying phantom feeder bar shares.

20. A method as recited in claim 19, wherein the step of tallying phantom feeder bar shares includes assigning each contending phantom a prorated share of a respective feeder bar based on feeder bar share weights of each contending phantom.

21. A method as recited in claim 10, wherein the analyzing comprises the steps:

grouping different feeder types based on part types specified in the program descriptors into feeder groups and assigning a specific order for processing of the feeder groups; and assigning feeder types, the feeder type assigner including:
computing a desirability of each phantom gripper;
selecting a most desirable phantom gripper based on the computed desirability and computing a desirability of each feeder type;
selecting a slot combination on a feeder bar assigned to the phantom gripper;
assigning a most desirable feeder type to a most desirable slot and for tallying the most desirable slot to the phantom gripper;
updating a feeder bar space assigned value; and
recalculating flowline feeder bar space available.

22. A method as recited in claim 10, wherein the step of analyzing feeder types and feeder slots comprises:

calculating a slot desirability; and assigning trays to a tray stacker in a prespecified pattern.

23. A method as recited in claim 10, wherein the step of assigning parts to charges comprises the steps of:

leveling time buckets associated with an FCM machine and charges within a charge map for an ACM machine.

24. A method for producing a layout and charge maps for a flowline of component placement machines, each machine comprising a plurality of grippers, each gripper having a pipette module, a phi placement unit and a nozzle, and at least one feeder bar having a plurality of feeders, the method comprising:

creating problem descriptors based on at least one file containing a parts list, a definition of the flowline, and specifications of all hardware based on specified information;

finding a layout and charge maps meeting prespecified criteria, comprising the steps of:

adaptive searching and heuristic layout generating.

25. A method as recited in claim 24, wherein a user may preassign specifications in the at least one file.

26. A method as recited in claim 25, wherein the preassigned specifications may include at least one of the following:

a phi placement unit to a specific pipette module;

a phi placement unit and a nozzle to a specific pipette module;

a blocked pipette module;

a feeder bar to a specific pipette module with a specific phi placement unit and nozzle assigned or without a phi placement unit or nozzle assigned;

a blocked feeder bar;

feeder types for any slot on a specific feeder bar;

blocked feeder types; and part types for a specific feeder type.

27. A method as recited in claim 26, wherein:

at least one machine includes a tray stacker;

the user may further preassign at least one of the following:

a tray stacker to a specific pipette module with a phi placement unit and a nozzle assigned or without a phi placement unit or nozzle assigned;

a pallet to a specific slot on a specific tray stacker;

a pallet with trays to a specific slot on a specific tray stacker;

a blocked pallet;

a part type for a specific position within a specific tray; and a blocked tray.

28. A method as recited in claim 24, wherein:

a nozzle exchange unit having slots, holds a plurality of nozzles;

the heuristic layout generating step assigns nozzles to slots and the nozzles to specific pipette modules and phi placement units, and generates charge maps which can include swapping nozzles in and out of a nozzle exchange unit for use by at least one pipette module during operation.

29. A method as recited in claim 24, wherein:

the problem descriptors include estimations of pick and place time for parts; and the estimations include at least one of travel to a pick location, pick-up time, travel to an alignment camera, travel to fiducial marks, travel to place location, place time, and travel to a coplanarity checker.

* * * * *